US012765409B2

(12) United States Patent
Oh et al.

(10) Patent No.: US 12,765,409 B2
(45) Date of Patent: Oct. 13, 2026

(54) INTERCONNECTION STRUCTURE AND SEMICONDUCTOR PACKAGE INCLUDING THE SAME

(71) Applicant: Samsung Electronics Co., Ltd., Suwon-si (KR)

(72) Inventors: Dongjoon Oh, Suwon-si (KR); Junyun Kweon, Cheonan-si (KR); Jumyong Park, Cheonan-si (KR); Jin Ho An, Seoul (KR); Chungsun Lee, Anyang-si (KR); Hyunsu Hwang, Siheung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 220 days.

(21) Appl. No.: 18/655,879

(22) Filed: May 6, 2024

(65) Prior Publication Data

US 2024/0290702 A1 Aug. 29, 2024

Related U.S. Application Data

(62) Division of application No. 17/230,511, filed on Apr. 14, 2021, now Pat. No. 12,009,288.

(30) Foreign Application Priority Data

Aug. 24, 2020 (KR) ........................ 10-2020-0106056

(51) Int. Cl.
*H10W 70/685* (2026.01)
*H10W 70/60* (2026.01)
(Continued)

(52) U.S. Cl.
CPC ........ *H10W 70/685* (2026.01); *H10W 70/611* (2026.01); *H10W 70/614* (2026.01);
(Continued)

(58) Field of Classification Search
CPC ........... H01L 23/49822; H01L 23/3128; H01L 23/5386; H01L 23/5389; H01L 24/16; H01L 25/105; H01L 2224/16227
See application file for complete search history.

(56) References Cited

U.S. PATENT DOCUMENTS 6,165,899 A 12/2000 Matumoto
6,265,780 B1 7/2001 Yew et al.
(Continued)

FOREIGN PATENT DOCUMENTS

JP 2001168191 A 6/2001
JP 3399252 B2 4/2003
(Continued)

*Primary Examiner* — Jacob Y Choi
*Assistant Examiner* — Neil R Prasad
(74) *Attorney, Agent, or Firm* — Harness, Dickey & Pierce, P.L.C.

(57) ABSTRACT

Disclosed are interconnection structures and semiconductor packages. The interconnection structure includes a first dielectric layer and a first hardmask pattern that are sequentially stacked, and a first interconnection pattern that penetrates the first hardmask pattern and the first dielectric layer. The first hardmask pattern includes a dielectric material having an etch selectivity with respect to the first dielectric layer. The first interconnection pattern includes a via part, a first pad part, and a line part that are integrally connected to each other. The first pad part vertically overlaps the via part. The line part extends from the first pad part. A level of a bottom surface of the first pad part is lower than a level of a bottom surface of the line part.

20 Claims, 19 Drawing Sheets

(51) Int. Cl.
*H10W 70/65* (2026.01)
*H10W 74/10* (2026.01)
*H10W 90/00* (2026.01)

(52) U.S. Cl.
CPC .......... *H10W 70/65* (2026.01); *H10W 74/117* (2026.01); *H10W 90/00* (2026.01); *H10W 90/724* (2026.01)

(56) References Cited

U.S. PATENT DOCUMENTS

| | | | | |
|---|---|---|---|---|
| 6,972,453 | B2 | 12/2005 | Ohtake et al. | |
| 7,364,836 | B2 | 4/2008 | Liu et al. | |
| 7,713,863 | B2 | 5/2010 | Sakata | |
| 8,026,608 | B2 * | 9/2011 | Sabatini | H10W 70/611 257/777 |
| 9,449,935 | B1 | 9/2016 | Shih et al. | |
| 10,490,517 | B2 | 11/2019 | Usami | |
| 10,930,625 | B2 | 2/2021 | Suk et al. | |
| 2008/0318409 | A1 * | 12/2008 | Sakata | H10W 20/071 257/E21.585 |
| 2009/0098729 | A1 | 4/2009 | Jang | |
| 2018/0350760 | A1 * | 12/2018 | Usami | H10W 20/42 |
| 2020/0364600 | A1 * | 11/2020 | Elsherbini | G06N 10/40 |
| 2021/0193577 | A1 * | 6/2021 | Lin | H10W 70/65 |

FOREIGN PATENT DOCUMENTS

| | | | |
|---|---|---|---|
| KR | 100744247 | B1 | 7/2007 |
| KR | 100940673 | B1 | 2/2010 |
| KR | 2020/0029088 | A | 3/2020 |

* cited by examiner

INTERCONNECTION STRUCTURE AND SEMICONDUCTOR PACKAGE INCLUDING THE SAME

CROSS-REFERENCE TO RELATED APPLICATION

This U.S. nonprovisional application is a divisional of U.S. application Ser. No. 17/230,511, filed Apr. 14, 2021, which claims priority under 35 U.S.C § 119 to Korean Patent Application No. 10-2020-0106056, filed on Aug. 24, 2020 in the Korean Intellectual Property Office, the disclosure of which is hereby incorporated by reference in its entirety.

BACKGROUND

Inventive concepts relate to an interconnection structure and/or a semiconductor package including the same.

A semiconductor package may include an integrated circuit chip for use in electronic products. A semiconductor package may include a semiconductor chip mounted on a printed circuit board and may include bonding wires or bumps to electrically connect the semiconductor chip to the printed circuit board. With the development of electronic industry, various studies have been conducted to improve reliability and durability of semiconductor packages.

SUMMARY

Some example embodiments of inventive concepts provide an interconnection structure with improved reliability and a semiconductor package including the same.

According to some example embodiments of inventive concepts, an interconnection structure may include a first dielectric layer and a first hardmask pattern that are sequentially stacked; and a first interconnection pattern that penetrates the first hardmask pattern and the first dielectric layer. The first hardmask pattern may include a dielectric material having an etch selectivity with respect to the first dielectric layer. The first interconnection pattern may include a via part, a first pad part, and a line part that are integrally connected to each other. The first pad part may vertically overlap the via part. The line part may extend from the first pad part. A level of a bottom surface of the first pad part may be lower than a level of a bottom surface of the line part.

According to some example embodiments of inventive concepts, a semiconductor package may include a first redistribution substrate, a first semiconductor apparatus on the first redistribution substrate, and a first molding member covering the first semiconductor apparatus and the first redistribution substrate. The first redistribution substrate may include a first dielectric layer, a first hardmask pattern, a second dielectric layer, a second hardmask pattern, a first interconnection pattern, and a second interconnection pattern. The first dielectric layer, the first hardmask pattern, the second dielectric layer, and the second hardmask pattern may be sequentially stacked. The first interconnection pattern may penetrate the first hardmask pattern and the first dielectric layer. The second interconnection pattern may penetrate the second hardmask pattern and the second dielectric layer and may be connected to the first interconnection pattern. The first hardmask pattern and the second hardmask pattern may include a dielectric material having an etch selectivity with respect to the first dielectric layer and the second dielectric layer, respectively. The second interconnection pattern may include a first via part, a first pad part, and a first line part that are integrally connected to each other. The first pad part may vertically overlap the first via part. The first line part may extend from the first pad part. A width of the first pad part may be greater than a width of the first line part. A level of a bottom surface of the first pad part may be lower than a level of a bottom surface of the first line part.

According to some example embodiments of inventive concepts, a semiconductor package may include a first redistribution substrate, a first semiconductor apparatus on the first redistribution substrate; and a first molding member covering the first semiconductor apparatus and the first redistribution substrate. The first redistribution substrate may include a first dielectric layer, a first hardmask pattern, a second dielectric layer, a second hardmask pattern, a first interconnection pattern, and a second interconnection pattern. The first dielectric layer, the first hardmask pattern, the second dielectric layer, and the second hardmask pattern may be sequentially stacked. The first interconnection pattern may penetrate the first hardmask pattern and the first dielectric layer. The second interconnection pattern may penetrate the second hardmask pattern and the second dielectric layer and may be connected to the first interconnection pattern. Each of the first hardmask pattern and the second hardmask pattern includes a silicon oxide layer. A density of the second hardmask pattern may be different from a density of the first hardmask pattern.

DETAILED DESCRIPTION

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Some example embodiments of inventive concepts will now be described in detail with reference to the accompanying drawings to aid in clearly explaining inventive concepts.

Figure 1:
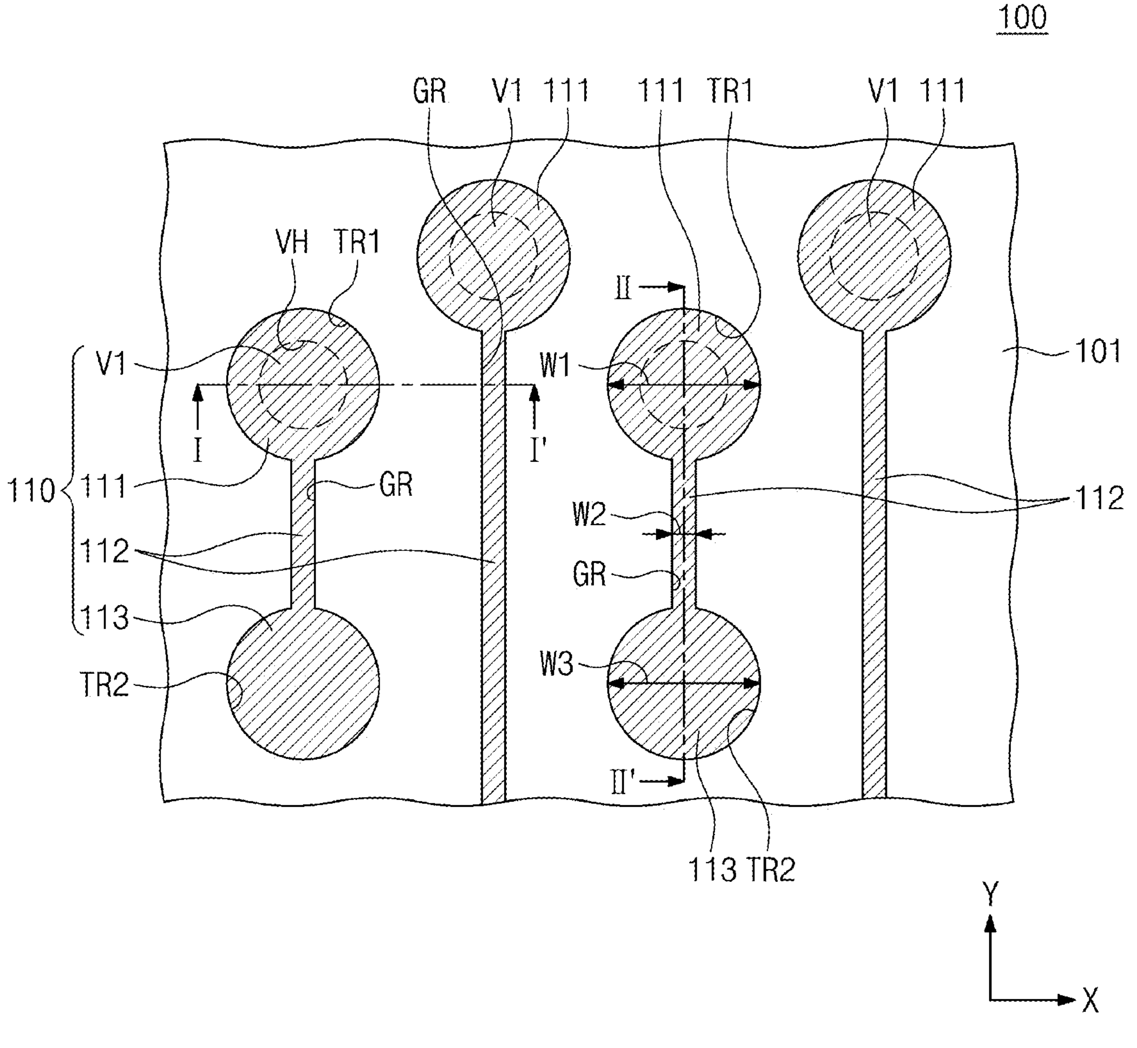
FIG. 1 illustrates a simplified plan view showing an interconnection structure according to some example embodiments of inventive concepts.
Figure 2:
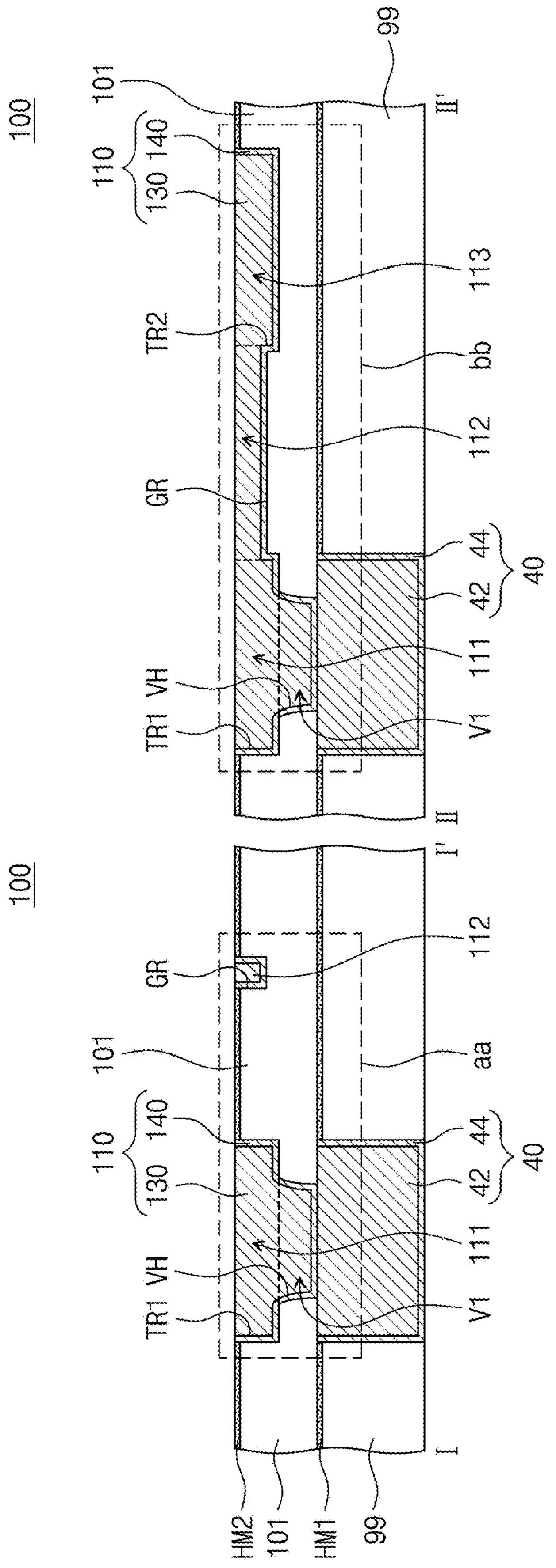
FIG. 2 illustrates a cross-sectional view taken along lines I-I' and II-II' of FIG. 1.

FIG. 1 illustrates a simplified plan view showing an interconnection structure according to some example embodiments of inventive concepts. FIG. 2 illustrates a cross-sectional view taken along lines I-I' and II-II' of FIG. 1. In FIG. 2, the cross-sectional view taken along line I-I' may indicate cross-sections of neighboring interconnection patterns 110, and the cross-sectional view taken along line II-II' may indicate cross-sections of a single interconnection pattern 110.

In all descriptions, an interconnection structure 100 may be called an interconnection substrate, an interconnection layer, a redistribution substrate, or a redistribution layer. The interconnection patterns 110 may also be called redistribution patterns.

Referring to FIGS. 1 and 2, the interconnection structure 100 according to the present embodiment may include a lower dielectric layer 99, a first hardmask pattern HM1, an internal dielectric layer 101, and a second hardmask pattern HM2. A lower conductive pad 40 may be disposed to penetrate the first hardmask pattern HM1 and the lower dielectric layer 99. The interconnection pattern 110 may be disposed to penetrate the second hardmask pattern HM2 and the internal dielectric layer 101, thereby being connected to the lower conductive pad 40.

Each of the lower dielectric layer 99 and the internal dielectric layer 101 may have a thickness of about 3 μm to about 10 μm, for example. Each of the first and second hardmask patterns HM1 and HM2 may have a thickness of about 0.1 μm to about 1 μm. Each of the lower and internal dielectric layers 99 and 101 may include a photo-imageable dielectric (PID) layer. The photo-imageable dielectric layer may include one or more of photosensitive polyimide, polybenzoxazole, phenolic polymers, and benzocyclobutene polymers. The first hardmask pattern HM1 and the second hardmask pattern HM2 may include a dielectric material having an excellent etch selectivity with respect to the lower dielectric layer 99 and the internal dielectric layer 101, respectively. For example, each of the first and second hardmask patterns HM1 and HM2 may include a silicon oxide layer.

The first hardmask pattern HM1 may have a density that is different from that of the second hardmask pattern HM2. As the density of the first or second hardmask pattern HM1 or HM2 increases (or, the more dense the first or second hardmask pattern HM1 or HM2 is), the first or second hardmask pattern HM1 or HM2 become more compressive. As the density of the first or second hardmask pattern HM1 or HM2 decreases (or, the more porous the first or second hardmask pattern HM1 or HM2 is), the first or second hardmask pattern HM1 or HM2 become more tensile and less compressive.

Alternatively, the first and second hardmask patterns HM1 and HM2 may be different in terms of composition of silicon and oxygen. For example, when a silicon oxide layer has a relatively high amount of silicon or oxygen, the silicon oxide layer may exhibit a compressive tendency. When a silicon oxide layer has a relatively low amount of silicon or oxygen, the silicon oxide layer may exhibit a tensile tendency.

In inventive concepts, densities and compositions of the first and second hardmask patterns HM1 and HM2 may be adjusted to control the degree of warpage of the interconnection structure 100 as a whole. For example, when the first hardmask pattern HM1 is present in a compressive state due to a relatively high density thereof, and when the second hardmask pattern HM2 is present in a tensile state due to a relatively low density thereof, the compressive state and the tensile state may counterbalance to allow the interconnection structure 100 to maintain its flat state as a whole without warpage.

The lower conductive pad 40 may have a pad shape. The lower conductive pad 40 may have a top surface coplanar with that of the first hardmask pattern HM1. The lower conductive pad 40 may include a first conductive pattern 42 and a first barrier/seed pattern 44 that covers a sidewall and a bottom surface of the first conductive pattern 42. The first conductive pattern 42 may include, for example, copper. The first barrier/seed pattern 44 may include a barrier layer and a seed layer that are sequentially stacked. The barrier layer may include, for example, one or more of titanium, tantalum, titanium nitride, and tantalum nitride. The seed layer may include, for example, copper.

The second hardmask pattern HM2 and the internal dielectric layer 101 may be provided therein with via holes VH, first trenches TR1, grooves GR, and second trenches TR2. The first trenches TR1 may be spatially connected to corresponding upper portions of the via holes VH. The first trenches TR1 may be spatially connected to corresponding grooves GR. The second trenches TR2 may be spatially connected to corresponding grooves GR, and may be spatially connected through the grooves GR to the first trenches TR1. The via hole VH may expose at least a portion of the top surface of the lower conductive pad 40.

The via hole VH and the first trench TR1 may vertically overlap each other. The via hole VH and the first trench TR1 may each have a circular shape or an almost circular shape when viewed in plan. The via hole VH and the first trench TR1 may each have a tetragonal shape, a triangular shape, or any suitable shape without being limited to the circular shape.

The via hole VH may have a diameter less than that of the first trench TR1. A bottom surface of the via hole VH, a sidewall of the via hole VH, a bottom surface of the first trench TR1, and a sidewall of the first trench TR1 may be sequentially connected to each other to constitute an injector or syringe shape.

Each of the first trench TR1, the groove GR, and the second trench TR2 may have a diameter and/or a width in one direction. The groove GR may have a second width W2 less than a first width W1 of the first trench TR1 and a third width W3 of the second trench TR2.

The interconnection patterns 110 may be provided to fill the via hole VH, the first trench TR1, the groove GR, and the second trench TR2. The interconnection patterns 110 may be spaced apart from each other in a first direction X and a second direction Y. The interconnection pattern 110 may include a via part V1, a via pad part 111, a line part 112, and a connection pad part 113 that are integrally connected to each other. The interconnection patterns 110 may have their top surfaces coplanar with that of the second hardmask pattern HM2. For example, the via part V1, the via pad part 111, the line part 112, and the connection pad part 113 may have their top surfaces coplanar with that of the second hardmask pattern HM2. The internal dielectric layer 101 may be a single layer. Bottom surfaces of the via pad part 111, the line part 112, and the connection pad part 113 and a sidewall of the via part VI may be in contact with the internal dielectric layer 101 and may be spaced apart from the first and second hardmask patterns HM1 and HM2.

No interface may be present between the via part V1, the via pad part 111, the line part 112, and the connection pad part 113. The via pad part 111 may be provided on and may vertically overlap the via part V1. The line part 112 may have a linear shape that extends from the via pad part 111. The connection pad part 113 may be connected to a distal end of the line part 112 and may be spaced apart from the via pad part 111 across the line part 112.

The via part V1 may physically contact the lower conductive pad 40. When another interconnection structure is disposed on the interconnection structure 100, the connection pad part 113 may physically contact a via part of the another interconnection structure. The lower conductive pad 40 may correspond to the connection pad part 113 of other interconnection structure.

The via part V1 may be provided in the via hole VH. The via part V1 may have a shape that corresponds to that of the via hole VH. The via pad part 111 may be provided in the first trench TR1 and may have a shape that corresponds to that of the first trench TR1. The line part 112 may be provided in the groove GR and may have a shape that corresponds to that of the groove GR. The connection pad part 113 may be provided in the second trench TR2 and may have a shape that corresponds to that of the second trench TR2.

The interconnection pattern 110 may include a second barrier/seed pattern 140 and a second conductive pattern 130. The second barrier/seed pattern 140 may conformally cover (or may have a constant thickness regardless of position on) a sidewall and a bottom surface of each of the via hole VH, the first trench TR1, the groove GR, and the second trench TR2. The second barrier/seed pattern 140 may include a barrier layer and a seed layer that are sequentially stacked. The barrier layer may include one or more of titanium, tantalum, titanium nitride, and tantalum nitride. The seed layer may include copper. The second conductive pattern 130 may include, for example, copper (Cu). The second barrier/seed pattern 140 may be interposed between the second conductive pattern 130 and the internal dielectric layer 101. The second conductive pattern 130 of the via part V1 and the second conductive pattern 130 of the via pad part 111 may be integrally formed with each other and may be connected to each other without an interface therebetween.

Figure 3:
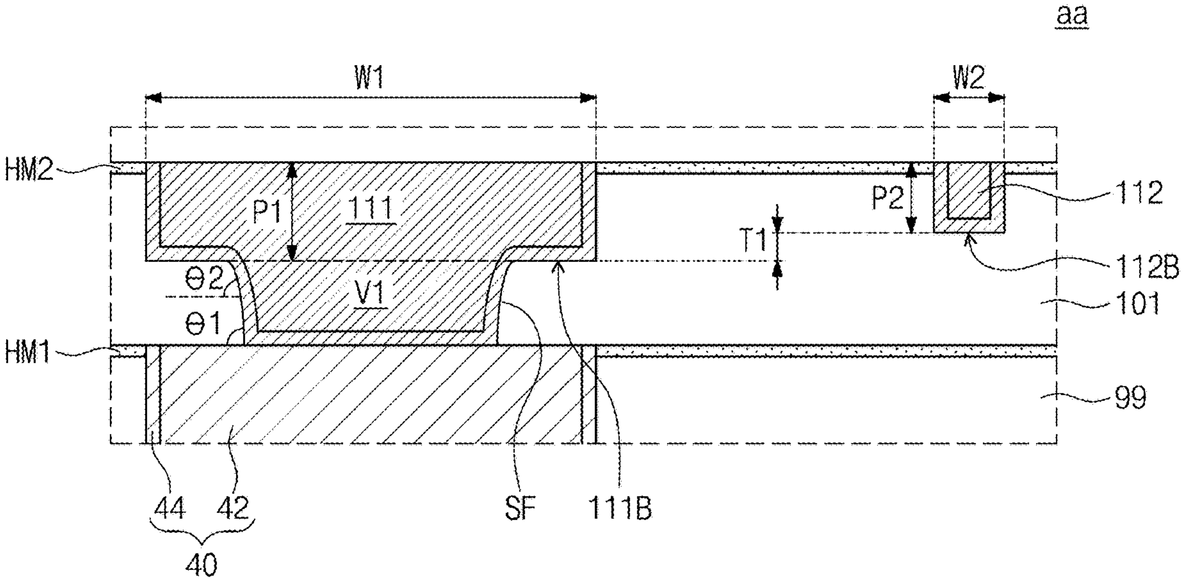
FIG. 3 illustrates an enlarged view showing section 'aa' of FIG. 2.
Figure 4:
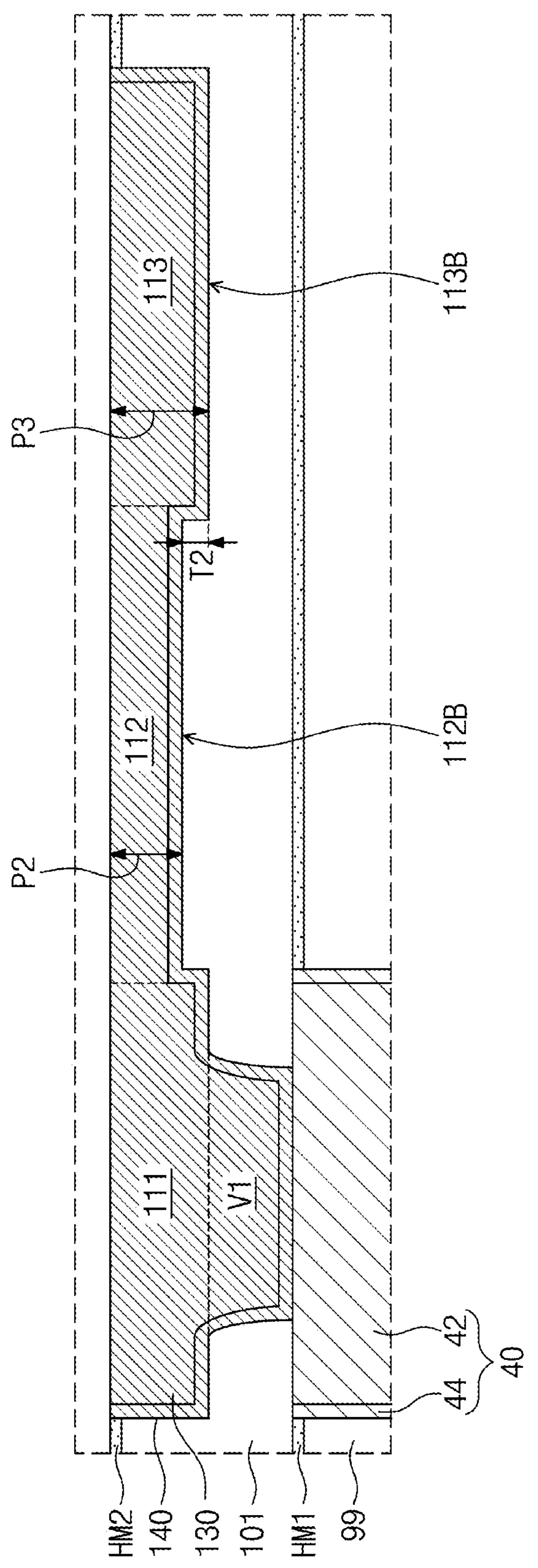
FIG. 4 illustrates an enlarged view showing section 'bb' of FIG. 2.

FIG. 3 illustrates an enlarged view showing section 'aa' of FIG. 2. FIG. 4 illustrates an enlarged view showing section 'bb' of FIG. 2.

Referring to FIGS. 2 to 4, the via part V1 may have a sidewall SF that is rounded. The sidewall SF of the via part V1 may have a slope that is changed with increasing distance in a vertical direction from the top surface of the first hardmask pattern HM1. For example, an angle between the top surface of the lower conductive pad 40 and the sidewall SF of the via part V1 may be reduced from a first angle θ1 to a second angle θ2 as the sidewall SF approaches the top surface (or region) of the via part V1 from a bottom surface of the via part V1. The reduction in angle may cause the slope of the sidewall SF of the via part V1 to become gentler as the sidewall SF approaches the top surface of the via part VI from the bottom surface of the via part V1.

The top surface of the via part V1 may be located at the same level as that of a bottom surface 111B of the via pad part 111. The bottom surface 111B of the via pad part 111 may be located at a lower level than that of a bottom surface 112B of the line part 112. For example, a level difference T1 between the bottom surface 111B of the via pad part 111 and the bottom surface 112B of the line part 112 may range from about 0.3 μm to about 0.8 μm.

The via pad part 111 may have a first thickness P1 of about 3.8 μm to about 4.0 μm, and the line part 112 may have a second thickness P2 of about 3.2 μm to about 3.5 μm. The first thickness P1 of the via pad part 111 may be about 1.1 times to about 1.25 times the second thickness P2 of the line part 112.

The via pad part 111 may have a first width W1 greater than a second width W2 of the line part 112. The first width W1 of the via pad part 111 may be equal to or greater than about 7 times the second width W2 of the line part 112. The second width W2 of the line part 112 may range from more than about 0 μm to about 3 μm. For example, the first width W1 of the via pad part 111 may be about 15 μm, and the second width W2 of the line part 112 may be about 2 μm.

The connection pad part 113 may have a bottom surface 113B at a lower level (or height) than that of the bottom surface 112B of the line part 112. The connection pad part 113 may have a third thickness P3 less than the second thickness P2 of the line part 112. For example, a level difference T2 between the bottom surface 113B of the connection pad part 113 and the bottom surface 112B of the line part 112 may range from about 0.3 μm to about 0.8 μm.

Referring back to FIG. 1, the connection pad part 113 may have a third width W3 less than the second width W2 of the line part 112. The first width W1 of the via pad part 111, the second width W2 of the line part 112, and the third width W3 of the connection pad part 113 may respectively correspond to the first width W1 of the first trench TR1, the second width W2 of the groove GR, and the third width W3 of the second trench TR2.

The previous description about the widths, the positional relationship between the bottom surface levels, or the like of the via pad part 111, the line part 112, and the connection pad part 113 may be identically applicable not only to a single interconnection pattern, but to a plurality of interconnection patterns. For example, based on FIG. 2, when the interconnection pattern 110 on a left side is called a first interconnection pattern, and when the interconnection pattern 110 on a right side is called a second interconnection pattern, the first and second interconnection patterns may transmit signals that are independent of each other. The bottom surface 111B of the via pad part 111 included in the first interconnection pattern may be located at a lower level than that of the bottom surface 112B of the line part 112 included in the second interconnection pattern.

Figure 5:
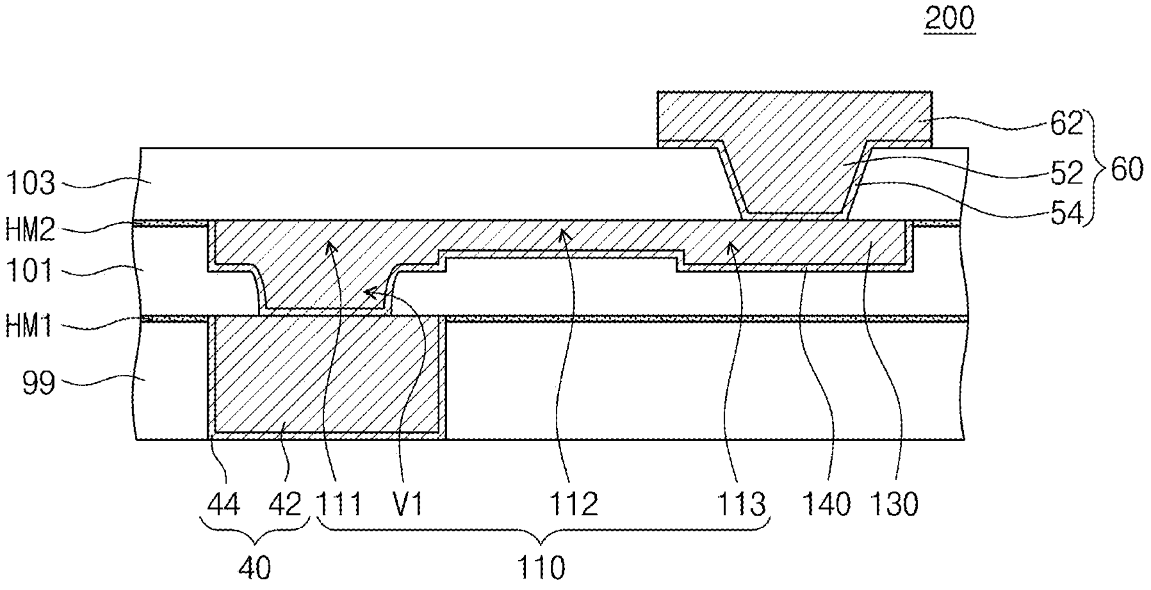
FIG. 5 illustrates a cross-sectional view showing an interconnection structure according to some example embodiments of inventive concepts.

FIG. 5 illustrates a cross-sectional view showing an interconnection structure according to some example embodiments of inventive concepts.

Referring to FIG. 5, an interconnection structure 200 according to the present embodiment may have a structure in which an upper dielectric layer 103 and an upper interconnection pattern 60 are disposed on the cross-section taken along line II-II' of FIGS. 1-2. The upper dielectric layer 103 may include the same material as that of the lower and internal dielectric layers 99 and 101. The upper dielectric layer 103 may have a top surface that is exposed without being covered with a hardmask pattern. The upper interconnection pattern 60 may include an upper via part 52, an upper pad part 62 on the upper via part 52, and an upper barrier/seed pattern 54 interposed between the upper via part 52 and the upper dielectric layer 103 and between the upper pad part 62 and the upper dielectric layer 103. The upper via part 52 may penetrate the upper dielectric layer 103 and may be adjacent to the connection pad part 113 of the interconnection pattern 110. The upper via part 52 may have a sidewall that is inclined and shaped like an inclined straight line. The sidewall of the upper via part 52 may not be rounded. The upper via part 52 and its overlying upper pad part 62 may be integrally connected to each other. The upper via part 52 and its overlying upper pad part 62 may each include copper. The upper barrier/seed pattern 54 may include a barrier layer and a seed layer that are sequentially stacked. Other configurations may be identical or similar to those discussed with reference to FIGS. 1 to 4.

Figure 7:
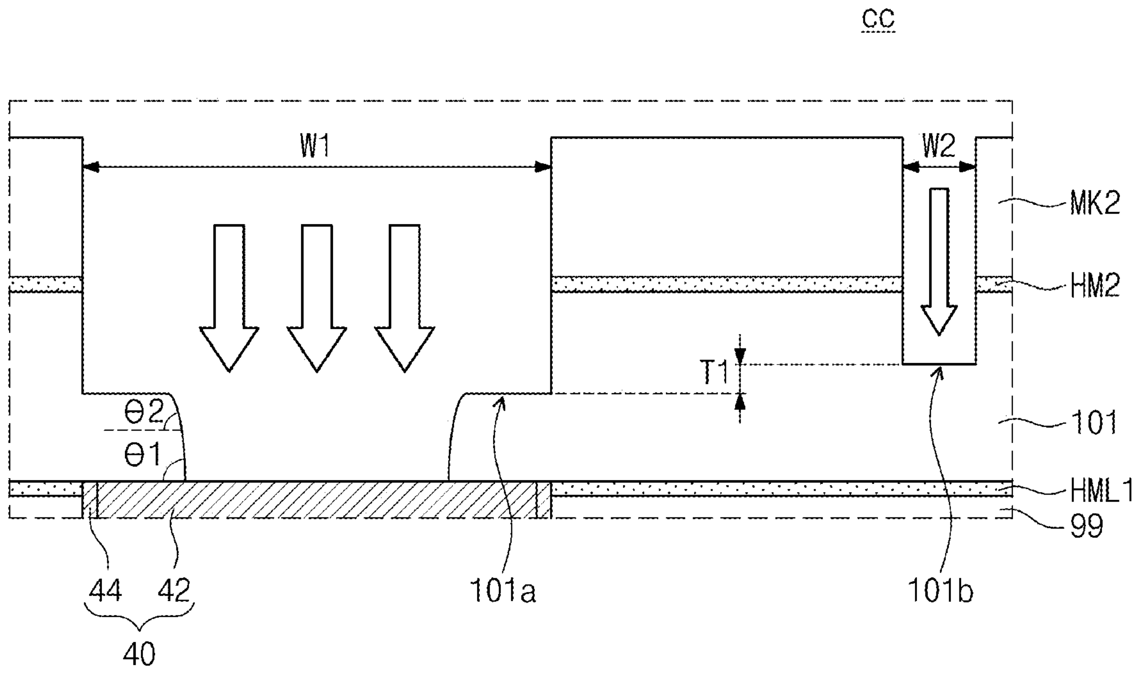
FIG. 7 illustrates an enlarged view showing section 'cc' of FIG. 6F.
Figure 8A:
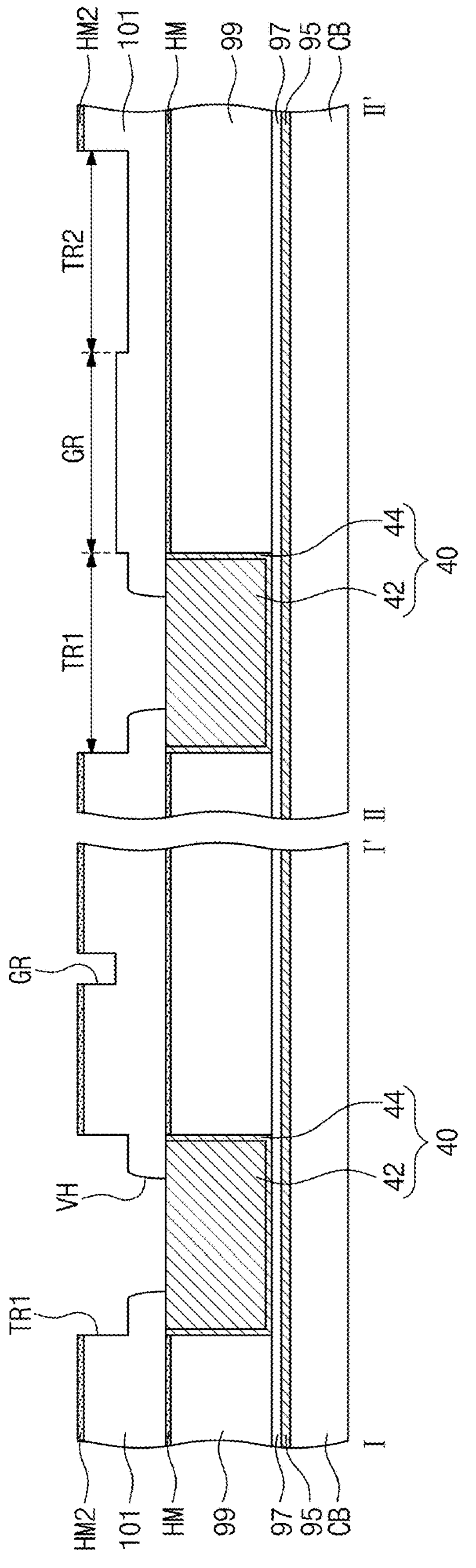
FIGS. 8A and 8B illustrate cross-sectional views showing a method of fabricating an interconnection structure having the cross-section of FIG. 2.
Figure 8B:
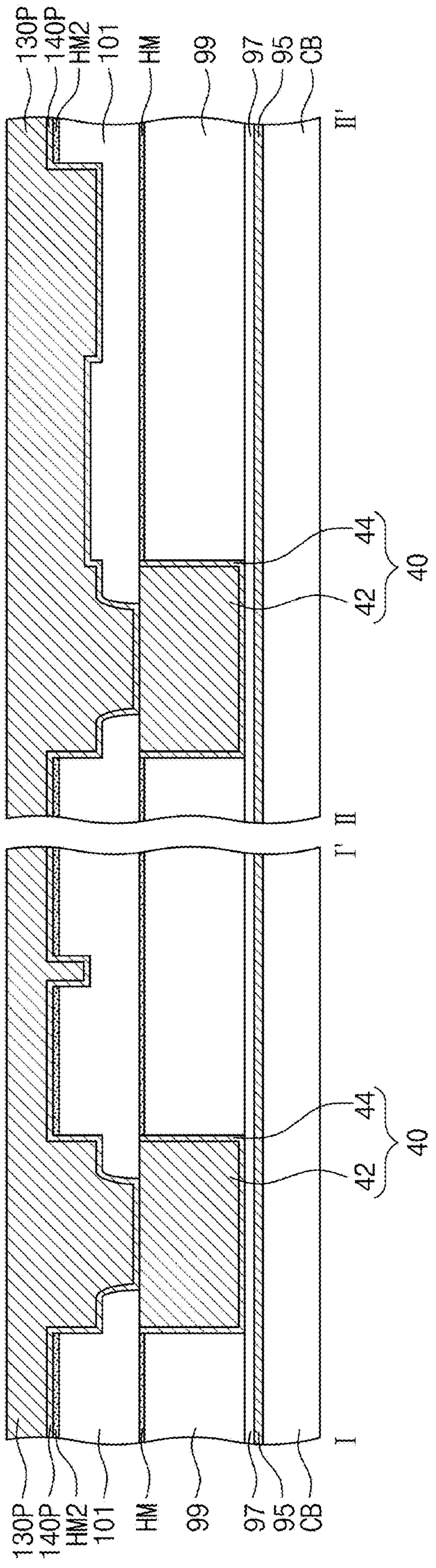

FIGS. 6A to 6F illustrate cross-sectional views showing a method of fabricating an interconnection structure having the cross-section of FIG. 2. FIG. 7 illustrates an enlarged view showing section 'cc' of FIG. 6F. FIGS. 8A and 8B illustrate cross-sectional views showing a method of fabricating an interconnection structure having the cross-section of FIG. 2.

Figure 6A:
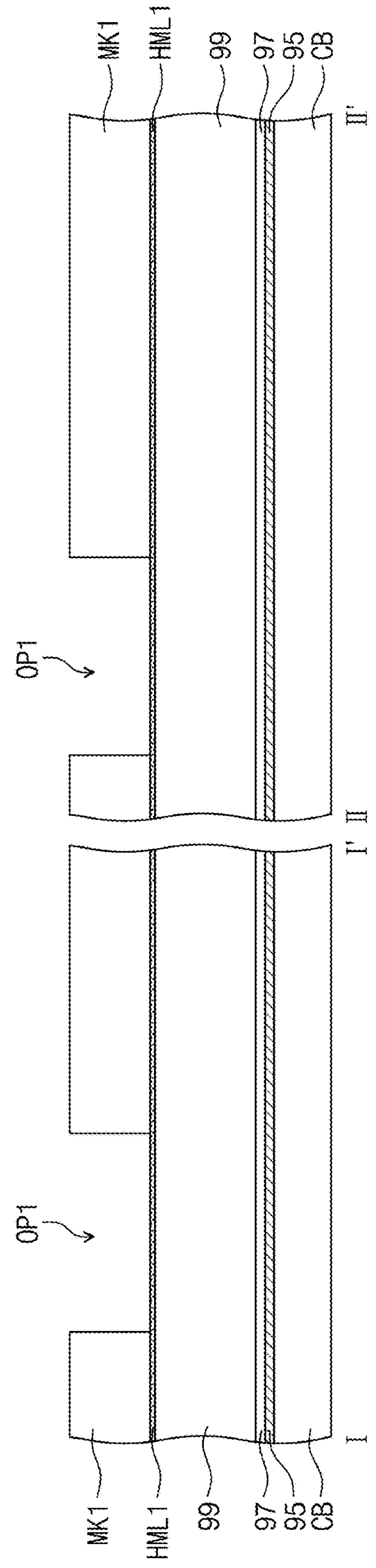
FIGS. 6A to 6F illustrate cross-sectional views showing a method of fabricating an interconnection structure having the cross-section of FIG. 2.

Referring to FIG. 6A, a first separation layer 95 and a second separation layer 97 may be sequentially formed on a carrier substrate CB. The carrier substrate CB may be formed of, for example, glass. The first separation layer 95 may be, for example, a titanium layer. The second separation layer 97 may be, for example, a photo-imageable dielectric (PID) layer. A lower dielectric layer 99 and a first hardmask layer HML1 may be sequentially formed on the second separation layer 97. The lower dielectric layer 99 may be formed by, for example, coating and cure processes. The lower dielectric layer 99 may be, for example, a photo-imageable dielectric (PID) layer. The photo-imageable dielectric (PID) layer may include, for example, one or more of photosensitive polyimide, polybenzoxazole, phenolic polymers, and benzocyclobutene polymers. The photo-imageable dielectric (PID) layer that constitutes the second separation layer 97 may have a different composition or property from that of the photo-imageable dielectric (PID) layer that constitutes the lower dielectric layer 99.

The first hardmask layer HML1 may be formed of a silicon oxide layer. The first hardmask layer HML1 may be formed by a deposition process, such as chemical vapor deposition (CVD), physical vapor deposition (PVD), or atomic layer deposition (ALD). An amount of a source gas or a power of a deposition chamber may be adjusted in the deposition process, and thus it may be possible to control a density of the first hardmask layer HML1 or a composition of silicon and oxygen included in the first hardmask layer HML1. A first mask pattern MK1 may be formed on the first hardmask layer HML1. The first mask pattern MK1 may be, for example, a photoresist pattern. The photoresist pattern may be formed by coating, baking, exposing, and developing a photoresist layer. The first mask pattern MK1 may include a first opening OP1 that exposes the first hardmask layer HML1.

Figure 6B:
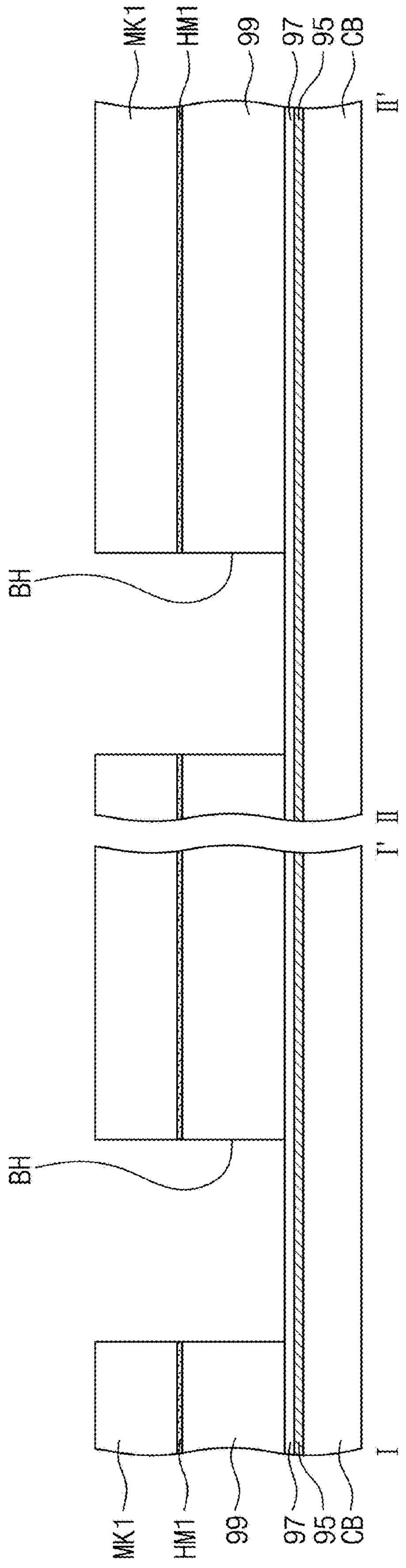

Referring to FIG. 6B, the first mask pattern MK1 may be used as an etching mask to etch the first hardmask layer HML1 to form a first hardmask pattern HM1. The lower dielectric layer 99 may be etched to form a lower hole BH that exposes the second separation layer 97. The first hardmask pattern HM1 may serve as an etching mask when the lower dielectric layer 99 is etched. When the first mask pattern MK1 is formed of a photoresist pattern, and when the lower dielectric layer 99 is formed of a photo-imageable dielectric (PID) layer, the first mask pattern MK1 and the lower dielectric layer 99 may have etch selectivity properties that are not high with respect to each other. When, without the first hardmask pattern HM1, the first mask pattern MK1 is used alone to etch the lower dielectric layer 99, the first mask pattern MK1 may all be removed before the lower hole BH is formed, and thus a top surface of the lower dielectric layer 99 may be exposed. Therefore, there may be problems associated with an etching of an upper portion of the lower dielectric layer 99 or with not-open issues occurring at the lower hole BH.

In contrast, in inventive concepts, because the first hardmask pattern HM1 includes a dielectric material having an excellent etch selectivity with respect to the lower dielectric layer 99, even when the first mask pattern MK1 is all removed, the first hardmask pattern HM1 may still be used to continuously perform an etching process on the lower dielectric layer 99. In this case, the first hardmask pattern HM1 may protect not to expose the top surface of the lower dielectric layer 99. Therefore, problems associated with an etching of an upper portion of the lower dielectric layer 99 and/or with not-open issues occurring at the lower hole BH may be limited and/or prevented.

In addition, in inventive concepts, because the first hardmask layer HML1 is formed of a dielectric layer, no separate process may be required to remove the first hardmask layer HML1 and thus a simplified fabrication may be achieved. Moreover, an etching process on the first hardmask layer HML1 and an etching process on the lower dielectric layer 99 may be in-situ performed in a single etching chamber. Accordingly, a simplified fabrication may be accomplished.

Figure 6C:
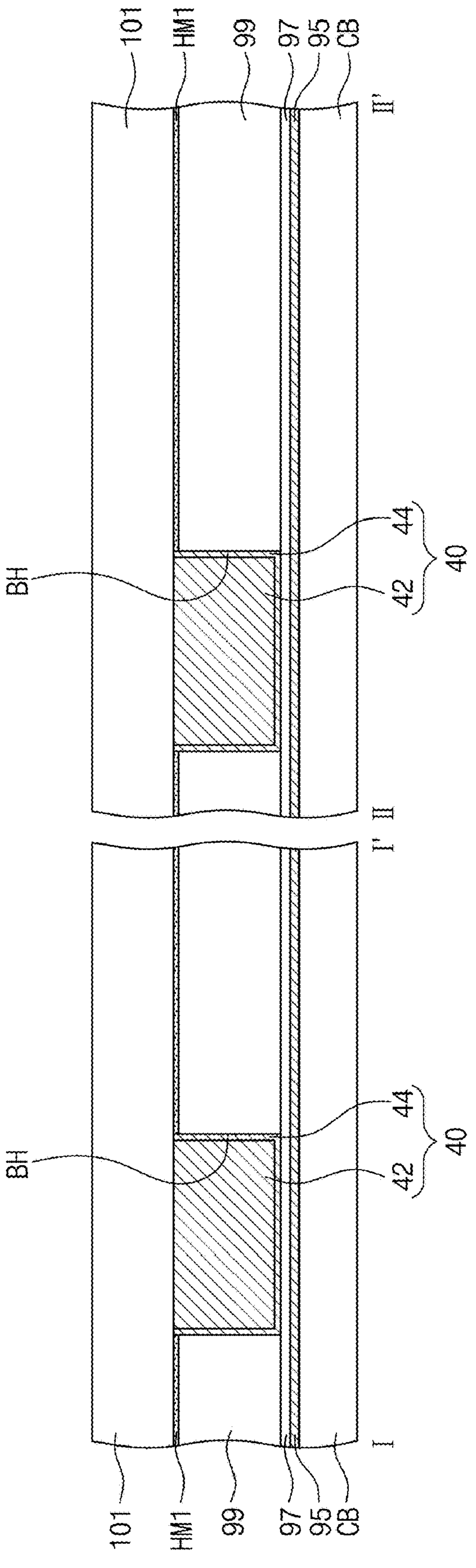

Referring to FIGS. 6B and 6C, when the first mask pattern MK1 remains, the remaining first mask pattern MK1 may be removed. A first barrier/seed layer may be conformally formed on the first hardmask pattern HM1, and an electroplating process may be performed to form a metal layer that fills the lower hole BH. A chemical mechanical polishing (CMP) process may be performed to remove the first barrier/seed layer and the metal layer from the first hardmask pattern HM1 and to form a lower conductive pad 40. In this case, the first hardmask pattern HM1 may serve as a polishing stop layer in the CMP process.

Referring to FIG. 6C, an internal dielectric layer 101 may be formed on the first hardmask pattern HM1. The internal dielectric layer 101 may be formed by, for example, a coating process. The internal dielectric layer 101 may be, for example, a photo-imageable dielectric (PID) layer. The photo-imageable dielectric (PID) layer may include, for example, one or more of photosensitive polyimide, polybenzoxazole, phenolic polymers, and benzocyclobutene polymers.

Figure 6D:
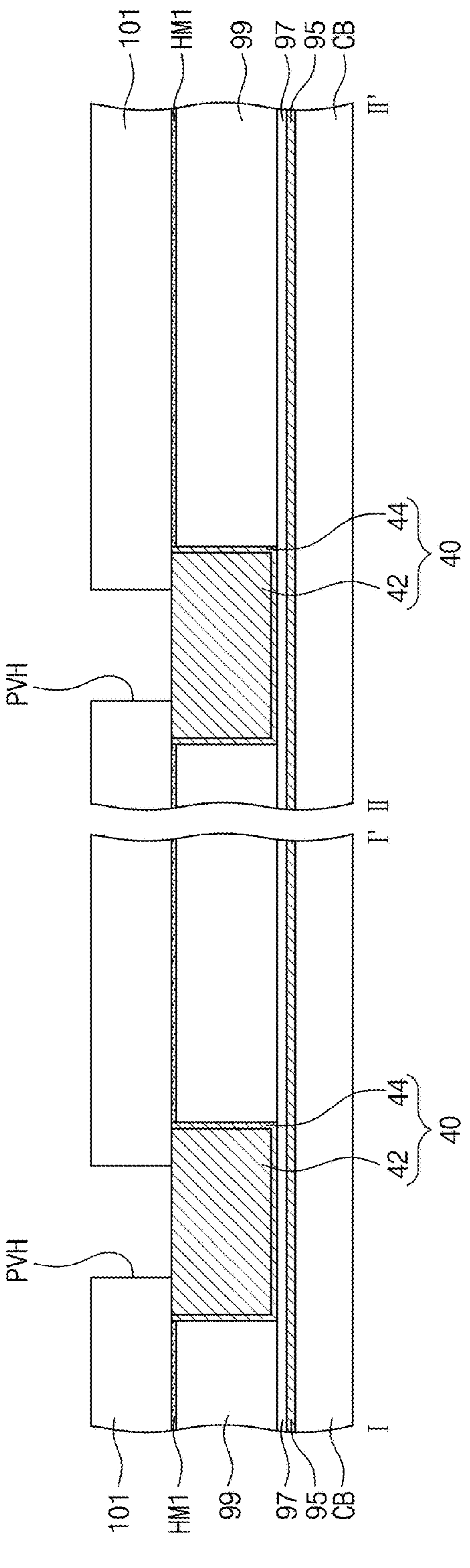

Referring to FIG. 6D, the internal dielectric layer 101 may undergo exposure and development processes to form a preliminary via hole PVH. The preliminary via hole PVH may expose the lower conductive pad 40. Afterwards, a cure process may be performed on the internal dielectric layer 101.

Figure 6E:
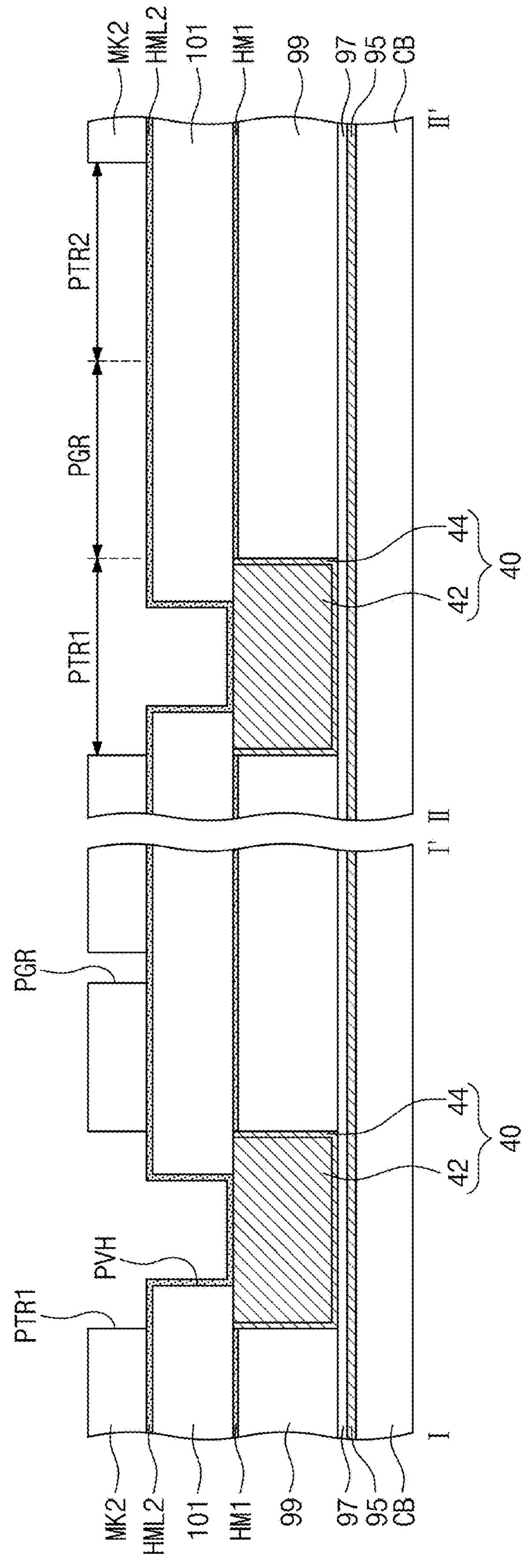

Referring to FIGS. 6D and 6E, a second hardmask layer HML2 may be conformally formed on an entire surface of the internal dielectric layer 101. The second hardmask layer HML2 may be formed of a silicon oxide layer. The second hardmask layer HML2 may be formed by a deposition process, such as chemical vapor deposition (CVD), physical vapor deposition (PVD), or atomic layer deposition (ALD). An amount of a source gas or a power of a deposition chamber may be adjusted in the deposition process, and thus it may be possible to control a density of the second hardmask layer HML2 or a composition of silicon and oxygen included in the second hardmask layer HML2. A second mask pattern MK2 may be formed on the second hardmask layer HML2. The second mask pattern MK2 may be, for example, a photoresist pattern. The photoresist pattern may be formed by coating, baking, exposing, and developing a photoresist layer. The second mask pattern MK2 may include a first preliminary trench PTR1, a preliminary groove PGR, and a second preliminary trench PTR2 all of which exposes the second hardmask layer HML2. The first preliminary trench PTR1 may vertically overlap the preliminary via hole PVH.

Figure 6F:
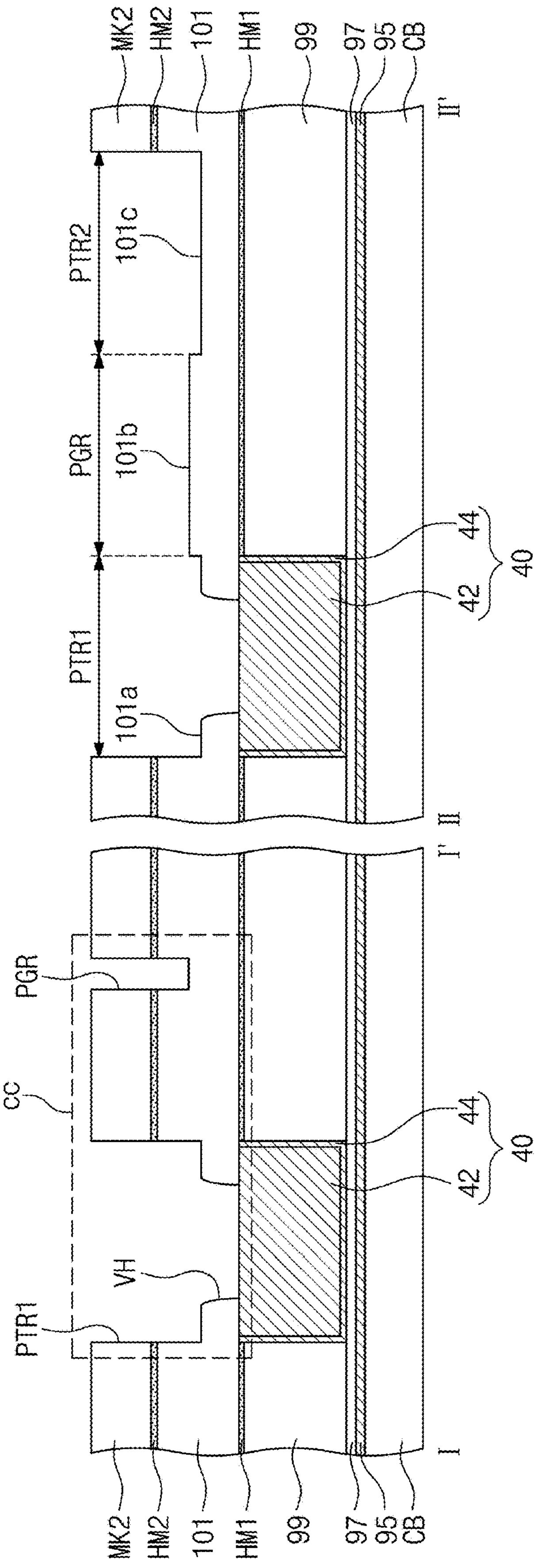

Referring to FIGS. 6F and 7, the second mask pattern MK2 may be used as an etching mask to etch the second mask layer HML2 that is exposed in the first preliminary trench PTR1, the preliminary groove PGR, and the second preliminary trench PTR2, thereby forming a second hardmask pattern HM2. The internal dielectric layer 101 may be etched. Therefore, the first preliminary trench PTR1, the preliminary groove PGR, and the second preliminary trench PTR2 may become deeper due to transfer of their planar shapes. In addition, a via hole VH may be formed to expose the lower conductive pad 40.

In the etching process, depths of the first and second preliminary trenches PTR1 and PTR2 may increase at a rate greater than that of a depth of the preliminary groove PGR. For example, the second hardmask layer HML2 and the internal dielectric layer 101 may be etched at a rate that is greater in the first and second preliminary trenches PTR1 and PTR2 than in the preliminary groove PGR. For more detail, the first preliminary trench PTR1 may have a first width W1 equal to or greater than about 7 times a second width W2 of the preliminary groove PGR. The width W2 of the preliminary trench PTR may be extremely small, such as greater than about 0 μm and equal to or less than about 3 μm, and thus during the etching process, a space capable of receiving an etchant may be much narrower in the preliminary groove PGR than in the first preliminary trench PTR1. Therefore, a loading effect may etch the second hardmask layer HML2 and the internal dielectric layer 101 at a rate that is less in the preliminary groove PGR than in the first and second preliminary trenches PTR1 and PTR2.

As a result, after the etching process is terminated, the first preliminary trench PTR1 and the second preliminary trench PTR2 respectively may have a bottom surface 101*a* and a bottom surface 101*c* each of which is located at a lower level than that of a bottom surface 101*b* of the preliminary groove PGR. For example, a level difference T1 between the bottom surface 101*a* of the first preliminary trench PTR1 and the bottom surface 101*b* of the preliminary groove PGR may range from about 0.3 μm to about 0.8 μm.

According to inventive concepts, an etching process may cause the via hole VH to have a rounded sidewall. In the etching process, an entrance of the via hole VH may be more exposed to an etching gas than an inside of the via hole VH, and thus the entrance of the via hole VH may be over-etched to form the rounded sidewall profile of the via hole VH. The sidewall of the via hole VH may have a slope that becomes reduced from a first angle θ1 to a second angle θ2 with increasing distance from the lower conductive pad 40.

The second preliminary trench PTR2 may be etched faster than the preliminary groove PGR. After the etching process, the bottom surface 101*c* of the second preliminary trench PTR2 may be located at a lower level than that of the bottom surface 101*b* of the preliminary groove PGR.

When the internal dielectric layer 101 is etched, the second hardmask pattern HM2 may serve as an etching mask. When the second mask pattern MK2 is formed of a photoresist pattern, and when the internal dielectric layer 101 is formed of a photo-imageable dielectric (PID) layer, the second mask pattern MK2 and the internal dielectric layer 101 may have their etch selectivities that are not high with respect to each other. Therefore, before the via hole VH is formed (or opened) in the etching process, the second mask pattern MK2 may all be removed to expose the second hardmask pattern HM2 may be exposed. In inventive concepts, because the second hardmask pattern HM2 includes a dielectric material having an excellent etch selectivity with respect to the internal dielectric layer 101, even when the second mask pattern MK2 is all removed, the second hardmask pattern HM2 may still be used to continuously perform the etching process on the internal dielectric layer 101. In this case, the second hardmask pattern HM2 may protect a top surface of the internal dielectric layer 101 from being exposed. Therefore, problems associated with etching an upper portion of the internal dielectric layer 101 and/or with not-open issues occurring at the via hole VH may be limited and/or prevented.

In addition, in inventive concepts, because the second hardmask layer HML2 is formed of a dielectric layer, no separate process may be required to remove the second hardmask layer HML2 and thus a simplified fabrication may be achieved. Moreover, an etching process on the second hardmask layer HML2 and an etching process on the internal dielectric layer 101 may be in-situ performed in a single etching chamber. Accordingly, a simplified fabrication may be accomplished.

Referring to FIG. 8A, an ashing process may be performed to remove a remaining second mask pattern MK2. Therefore, the first preliminary trench PTR1 may be formed into a first trench TR1, the preliminary groove PGR may be formed into a groove GR, and the second preliminary trench PTR2 may be formed into a second trench TR2.

Referring to FIG. 8B, a second barrier/seed layer 140P and a metal layer 130P may be formed to conformally cover a sidewall and a bottom surface of the via hole VH, a sidewall and a bottom surface of the first trench TR1, a sidewall and a bottom surface of the groove GR, and the top surface of the internal dielectric layer 101. The second barrier/seed layer 140P may be formed by a deposition process, such as chemical vapor deposition (CVD), atomic layer deposition (ALD), or physical vapor deposition (PVD). The metal layer 130P may be formed by performing an electroplating process.

Referring back to FIGS. 2 and 8B, the metal layer 130P and the second barrier/seed layer 140P may undergo a chemical mechanical polishing (CMP) process to remove the metal layer 130P and the second barrier/seed layer 140P that are formed on the second hardmask pattern HM2, to expose a top surface of the second hardmask pattern HM2, and to form an interconnection pattern 110. In this case, the second hardmask pattern HM2 may serve as a polishing stop layer. The second separation layer 97, the first separation layer 95, and the carrier substrate CB may be removed from bottom surfaces of the lower dielectric layer 99 and the lower conductive pad 40. Accordingly, an interconnection structure 100 may be fabricated as shown in FIGS. 1 and 2.

In inventive concepts, a photoresist pattern may be used to form the mask patterns MK1 and MK2, and thus a fine pattern may be formed. Moreover, a hardmask pattern may be formed of a dielectric layer, and thus no process may be required to remove the hardmask pattern. Accordingly, a yield may increase and an interconnection structure may improve in reliability.

Further, a dielectric material may be used to form the hardmask patterns HM1 and HM2, which may result in better mechanical characteristics, better process control, and reduced etching dispersion. As a result, it may be possible to provide an interconnection structure and a semiconductor package with improved reliability.

Figure 9:
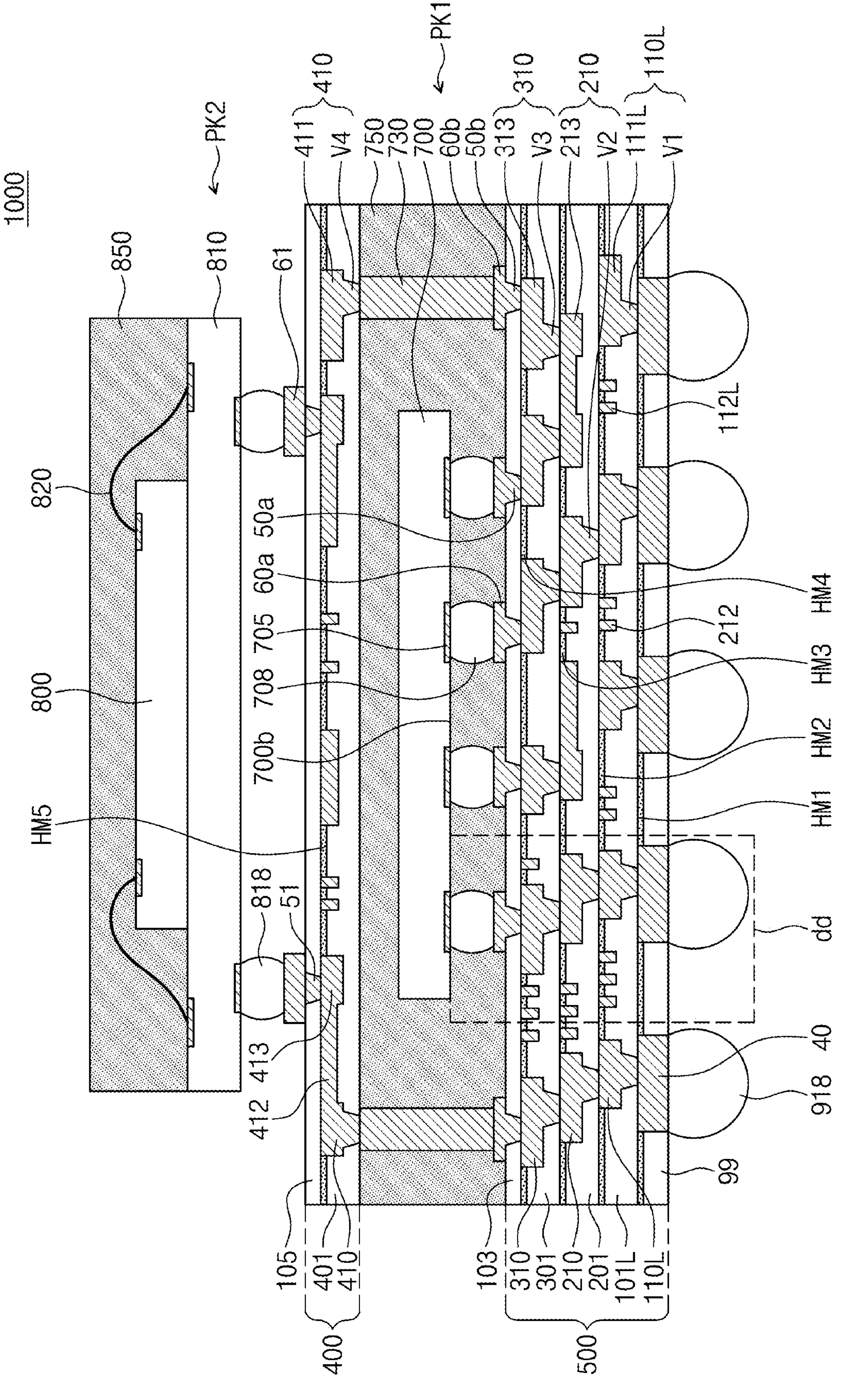
FIG. 9 illustrates a cross-sectional view showing a semiconductor package according to some example embodiments of inventive concepts.
Figure 10:
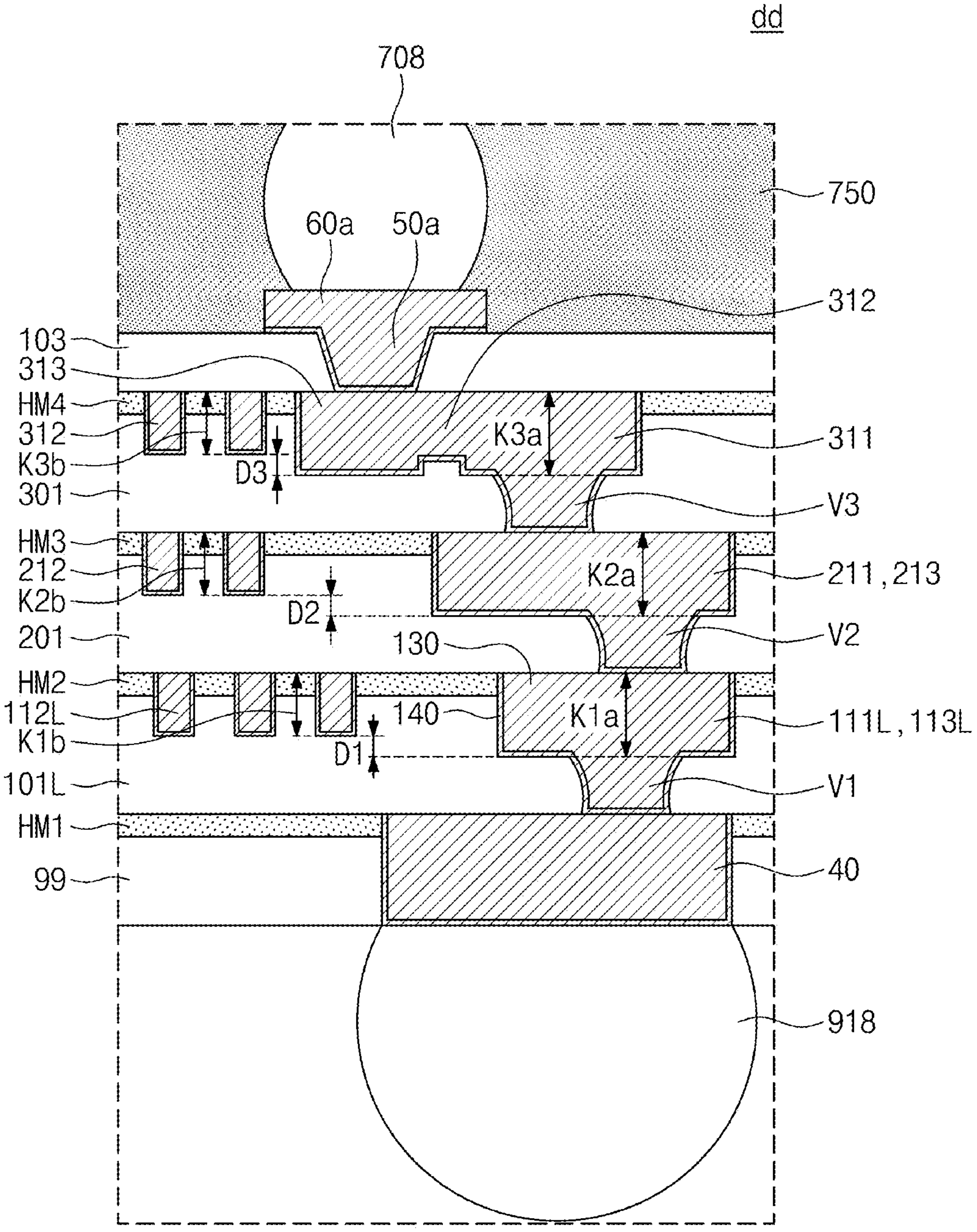
FIG. 10 illustrates an enlarged view showing section 'dd' of FIG. 9.

FIG. 9 illustrates a cross-sectional view showing a semiconductor package according to some example embodiments of inventive concepts. FIG. 10 illustrates an enlarged view showing a portion of FIG. 9. The semiconductor package of FIG. 9 may have a structure in which an interconnection structure according to inventive concepts is applicable to redistribution substrates.

Referring to FIGS. 9 and 10, a semiconductor package 1000 may include a first sub-semiconductor package PK1 and a second sub-semiconductor package PK2 on the first sub-semiconductor package PK1.

The first sub-semiconductor package PK1 may include a lower redistribution substrate 500, a first semiconductor apparatus 700, an upper redistribution substrate 600, and a first molding member 750. Each of the lower and upper redistribution substrates 500 and 600 may have a structure similar to that of the interconnection structure 100 discussed with reference to FIGS. 1 to 4.

The lower redistribution substrate 500 may include a lower dielectric layer 99, a first hardmask pattern HM1, a first dielectric layer 101L, a second hardmask pattern HM2, a second dielectric layer 201, a third hardmask pattern HM3, a third dielectric layer 301, a fourth hardmask pattern HM4, and a first upper dielectric layer 103 that are sequentially stacked. A photo-imageable dielectric (PID) layer may be used to form the lower dielectric layer 99, the first dielectric layer 101L, the second dielectric layer 201, the third dielectric layer 301, and the first upper dielectric layer 103. The first, second, third, and fourth hardmask patterns HM1, HM2, HM3, and HM4 may include a dielectric material having an etch selectivity (or excellent etch selectivity) with respect to the dielectric layers 99, 101L, 201, 301, and 103, respectively. The first to fourth hardmask patterns HM1 to HM4 may have different densities from each other. Each of the first to fourth hardmask patterns HM1 to HM4 may include a silicon oxide layer. The first to fourth hardmask patterns HM1 to HM4 may have different compositions of silicon and oxygen. Each of the first to fourth hardmask patterns HM1 to HM4 may have a thickness of about 0.1 μm to about 1 μm.

A lower conductive pad 40 may be disposed to penetrate the first hardmask pattern HM1 and the lower dielectric layer 99. The lower conductive pad 40 may be provided in plural, and the plurality of lower conductive pads 40 may have their pad shapes that are spaced apart from each other. External connection terminals 918 may be bonded to the lower conductive pads 40. The external connection terminals 918 may include one of solder balls, conductive bumps, and conductive pillars.

First redistribution patterns 110L may be provided to penetrate the second hardmask pattern HM2 and the first dielectric layer 101L. The first redistribution patterns 110L may have their shapes the same as or similar to that of the interconnection pattern 110 discussed with reference to FIGS. 1 to 4. For example, each of the first redistribution patterns 110L may include a first via part V1, a first via pad part 111L, a first line part 112L, and a first connection pad part 113L that are integrally connected to each other. The first via part V1 may contact the lower conductive pad 40. The first line part 112L may have a linear shape and may connect the first via pad part 111L to the first connection pad part 113L.

Second redistribution patterns 210 may be provided to penetrate the third hardmask pattern HM3 and the second dielectric layer 201. The second redistribution patterns 210 may have their shapes the same as or similar to that of the interconnection pattern 110 discussed with reference to FIGS. 1 to 4. For example, each of the second redistribution patterns 210 may include a second via part V2, a second via pad part 211, a second line part 212, and a second connection pad part 213 that are integrally connected to each other. The second via part V2 may contact the first redistribution pattern 110L. The second line part 212 may have a linear shape and may connect the second via pad part 211 to the second connection pad part 213.

Third redistribution patterns 310 may be provided to penetrate the fourth hardmask pattern HM4 and the third dielectric layer 301. The third redistribution patterns 310 may have their shapes the same as or similar to that of the interconnection pattern 110 discussed with reference to FIGS. 1 to 4. For example, each of the third redistribution patterns 310 may include a third via part V3, a third via pad part 311, a third line part 312, and a third connection pad part 313 that are integrally connected to each other. The third via part V3 may contact the second redistribution pattern 210. The third line part 312 may have a linear shape and may connect the third via pad part 311 to the third connection pad part 313.

The fourth hardmask pattern HM4 may be covered with the first upper dielectric layer 103. The first upper dielectric layer 103 may be provided therein with first upper via patterns 50*a* and second upper via patterns 50*b* spaced apart from the first upper via patterns 50*a*. The first and second upper via patterns 50*a* and 50*b* may contact the third redistribution patterns 310. The first upper dielectric layer 103 may be provided thereon with first upper conductive pads 60*a* and second upper conductive pads 60*b*. The first upper via pattern 50*a* and the first upper conductive pad 60*a* may be integrally connected to each other as the upper interconnection pattern 60 of FIG. 5. The second upper via pattern 50*b* and the second upper conductive pad 60*b* may be integrally connected to each other as the upper interconnection pattern 60 of FIG. 5. The first via pad part 111L (or the first connection pad part 113L) may have a bottom surface at a lower level than that a bottom surface of the first line part 112L, and a level difference D1 may range from about 0.3 μm to about 0.8 μm. The first via pad part 111L (or the first connection pad part 113L) may have a thickness K1*a* greater than a thickness K1*b* of the first line part 112L, and a thickness difference may range from about 0.3 μm to about 0.8 μm.

The second via pad part 211 (or the second connection pad part 213) may have a bottom surface at a lower level than that of a bottom surface of the second line part 212, and a level difference D2 may range from about 0.3 μm to about 0.8 μm. The second via pad part 211 (or the second connection pad part 213) may have a thickness K2*a* greater than a thickness K2*b* of the second line part 212, and a thickness difference may range from about 0.3 μm to about 0.8 μm.

The third via pad part 311 (or the third connection pad part 313) may have a bottom surface at a lower level than that of a bottom surface of the third line part 312, and a level difference D3 may range from about 0.3 μm to about 0.8 μm. The third via pad part 311 (or the third connection pad part 313) may have a thickness K3*a* greater than a thickness K3*b* of the third line part 312, and a thickness difference therebetween may range from about 0.3 μm to about 0.8 μm.

The thicknesses K1*a*, K2*a*, and K3*a* of the first, second, and third via pad parts 111L, 211, and 311 (or the first, second, and third connection pad parts 113L, 213, and 313) may be different from each other. The thicknesses K1*b*, K2*b*, and K3*b* of the first, second, and third line parts 112L, 212, and 312 may be different from each other. The thickness differences D1, D2, and D3 may be different from each other.

The first semiconductor apparatus 700 may be a single semiconductor die (or chip) or a sub-semiconductor package that includes a plurality of semiconductor dies. The semiconductor die may include one or both of a memory chip and a logic chip. The first semiconductor apparatus 700 may be one selected from an image sensor chip such as CIS (CMOS image sensor), a microelectromechanical system (MEMS) device chip, an application specific integrated circuit (ASIC) chip, and a memory device chip such as Flash memory, DRAM, SRAM, EEPROM, PRAM, MRAM, ReRAM, HBM (high bandwidth memory), and HMC (hybrid memory cubic). A first internal connection member 708 may connect the first upper conductive pad 60*a* to a chip pad 705 of the first semiconductor apparatus 700. The first internal connection member 708 may include one or more of solder balls, conductive bumps, and conductive pillars.

A mold via 730 may penetrate the first molding member 750 and may contact the second upper conductive pad 60*b*. The mold via 730 may include, for example, copper. The upper redistribution substrate 600 may be disposed on the first molding member 750.

The upper redistribution substrate 600 may include a fourth dielectric layer 401, a fifth hardmask pattern HM5, and a second upper dielectric layer 105. Fourth redistribution patterns 410 may be provided to penetrate the fifth hardmask pattern HM5 and the fourth dielectric layer 401. The fourth redistribution patterns 410 may have their shapes the same as or similar to that of the interconnection pattern 110 discussed with reference to FIGS. 1 to 4. For example, each of the fourth redistribution patterns 410 may include a fourth via part V4, a fourth via pad part 411, a fourth line part 412, and a fourth connection pad part 413 that are integrally connected to each other. The fourth via part V4 may contact the mold via 730. The fourth line part 412 may have a linear shape and may connect the fourth via pad part 411 to the fourth connection pad part 413. The relationship about thicknesses and levels of the fourth via part V4, the fourth via pad part 411, the fourth line part 412, and the fourth connection pad part 413 may be the same as or similar to that of the interconnection pattern 110 discussed with reference to FIGS. 1 to 4.

The fifth hardmask pattern HM5 may have a density different from that of at least one selected from the first to fourth hardmask patterns HM1 to HM4. The fifth hardmask pattern HM5 may include a silicon oxide layer. A composition of silicon and oxygen included in the fifth hardmask pattern HM5 may be different from that of at least one selected from the first to fourth hardmask patterns HM1 to HM4. The fifth hardmask pattern HM5 may have a thickness of about 0.1 μm to about 1 μm.

A third upper via pattern 51 may penetrate the second upper dielectric layer 105 and may contact the fourth connection pad part 413 of the fourth redistribution pattern 410. A third conductive pad 61 may be positioned on the second upper dielectric layer 105 and may be in contact with the third upper via pattern 51.

The second sub-semiconductor package PK2 may include a package substrate 810, a second semiconductor apparatus 800 mounted through a wire 820 on the package substrate 810, and a second molding member 850 that covers the second semiconductor apparatus 800. The second sub-semiconductor package PK2 may be electrically connected through a second internal connection member 818 to the upper redistribution substrate 600.

Figure 11:
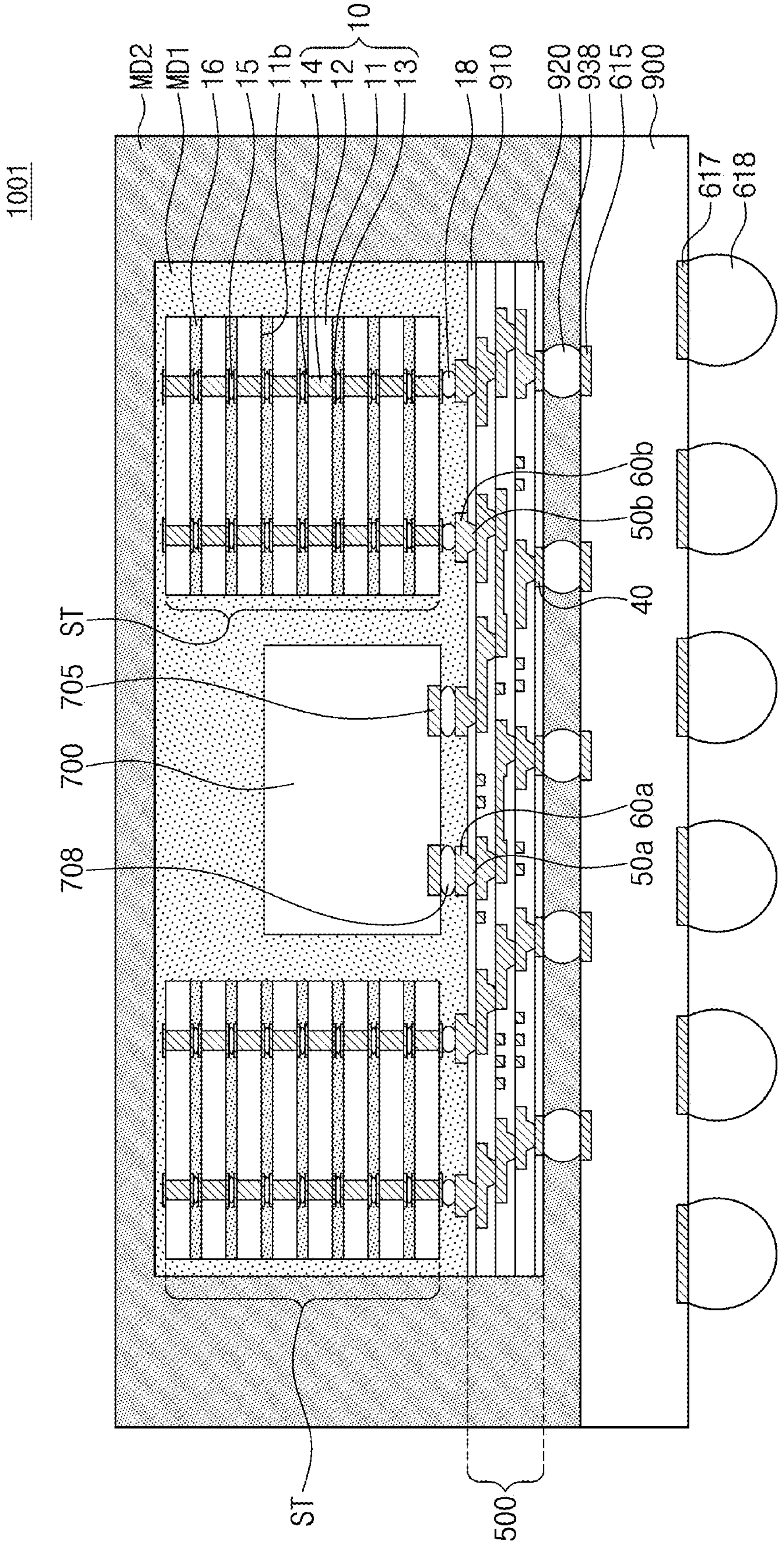
FIG. 11 illustrates a cross-sectional view showing a semiconductor package according to some example embodiments of inventive concepts.

FIG. 11 illustrates a cross-sectional view showing a semiconductor package according to some example embodiments of inventive concepts.

Referring to FIG. 11, a semiconductor package 1001 according to the present embodiment may include a package substrate 900, a redistribution substrate 500, a first semiconductor apparatus 700, and a second semiconductor apparatus ST. In the present embodiment, the redistribution substrate 500 may serve as an interposer and may be called a redistribution interposer.

The package substrate 900 may be, for example, a printed circuit board (PCB). The first semiconductor apparatus 700 may be substantially the same as the first semiconductor apparatus 700 discussed in FIGS. 9 and 10. The second semiconductor apparatus ST may have a sub-semiconductor package structure in which a plurality of semiconductor chips are stacked. The package substrate 900 may include upper substrate pads 615 and lower substrate pads 617.

The second semiconductor apparatus ST may include a plurality of second semiconductor chips 10 that are stacked in a vertical direction. The second semiconductor chips 10 may be provided therebetween with an adhesive layer 16, for example, a non-conductive film (NCF).

Each of the second semiconductor chips 10 may include a semiconductor substrate 11, through vias 12 that penetrate the semiconductor substrate 11, and first and second conductive pads 13 and 14 connected to corresponding through vias 12. The second semiconductor chips 10 may be provided therebetween with bumps 15 in contact with the first and second conductive pads 13 and 14.

The semiconductor substrate 11 may be a wafer-level substrate. The semiconductor substrate 11 may include silicon or germanium. The semiconductor substrate 11 may include a circuit layer (not shown) provided adjacent to one surface thereof. The circuit layer may include an integrated circuit (e.g., memory circuit). The through vias 12 may be electrically connected to the integrated circuit. The through vias 12 may include a conductive material. The first and second conductive pads 13 and 14 may include metal, such as copper or aluminum.

Each of the second semiconductor chips 10 may have a function different from that of the first semiconductor apparatus 700. For example, the first semiconductor apparatus may be a logic chip (e.g., application processor (AP)), and the second semiconductor chip 10 may be a memory chip.

The redistribution substrate 500 may be the same as or similar to the lower redistribution substrate 500 discussed with reference to FIGS. 9 and 10. A chip pad 705 of the first semiconductor apparatus 700 may be connected through a first internal connection member 708 to a first upper conductive pad 60*a* of the redistribution substrate 500. The second semiconductor apparatus ST may be connected through a second internal connection member 18 to a second upper conductive pad 60*b* of the redistribution substrate 500. A first molding member MD1 may cover the redistribution substrate 500, the first semiconductor apparatus 700, and the second semiconductor apparatuses ST.

A lower conductive pad 40 of the redistribution substrate 500 may be connected through a third internal connection member 938 to an upper substrate pad 615 of the package substrate 900. An external connection terminal 618 may be connected to a lower substrate pad 617 of the package substrate 900. A second molding member MD2 may cover the package substrate 900 and the first molding member MD1. Other configurations may be identical or similar to those discussed with reference to FIGS. 9 and 10.

Figure 12:
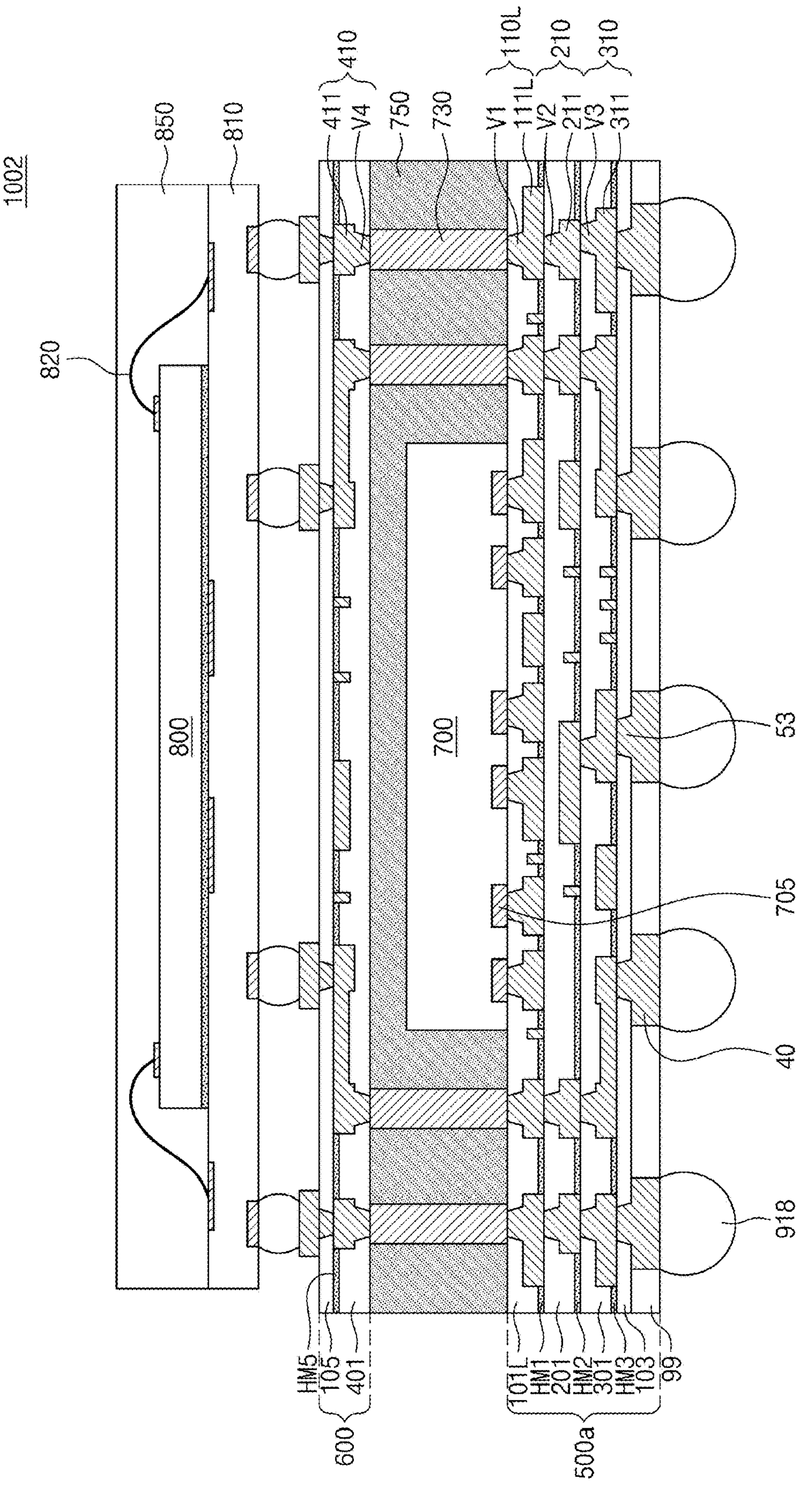
FIG. 12 illustrates a cross-sectional view showing a semiconductor package according to some example embodiments of inventive concepts.

FIG. 12 illustrates a cross-sectional view showing a semiconductor package according to some example embodiments of inventive concepts.

Referring to FIG. 12, a semiconductor package 1002 according to the present embodiment may include a lower redistribution substrate 500*a* that is different from the lower redistribution substrate 500 of FIG. 9. A first semiconductor apparatus 700 may contact the lower redistribution substrate 500*a*. The lower redistribution substrate 500*a* may include a first dielectric layer 101L, a first hardmask pattern HM1, a second dielectric layer 201, a second hardmask pattern HM2, a third dielectric layer 301, a third hardmask pattern HM3, an upper dielectric layer 103, and a lower dielectric layer 99 that are sequentially disposed from top to bottom.

One of first redistribution patterns 110L may penetrate the first hardmask pattern HM1 and the first dielectric layer 101L, thereby contacting a chip pad 705 of the first semiconductor apparatus 700. Another of first redistribution patterns 110L may penetrate the first hardmask pattern HM1 and the first dielectric layer 101L, thereby contacting a mold via 730. Referring to FIGS. 10 and 12, each of the first redistribution patterns 110L may include a first via part V1, a first via pad part 111L, a first line part 112L, and a first connection pad part 113L that are integrally connected to each other. The first via part V1 may be positioned on the first via pad part 111L. The first via part V1 may contact the chip pad 705 or the mold via 730.

Second redistribution patterns 210 may penetrate the second hardmask pattern HM2 and the second dielectric layer 201, thereby contacting the first redistribution patterns 110L. Referring to FIGS. 10 and 12, each of the second redistribution patterns 210 may include a second via part V2, a second via pad part 211, a second line part 212, and a second connection pad part 213 that are integrally connected to each other. The second via part V2 may be positioned on the second via pad part 211.

Third redistribution patterns 310 may penetrate the third hardmask pattern HM3 and the third dielectric layer 301, thereby contacting the second redistribution patterns 210. Referring to FIGS. 10 and 12, each of the third redistribution patterns 310 may include a third via part V3, a third via pad part 311, a third line part 312, and a third connection pad part 313 that are integrally connected to each other. The third via part V3 may be positioned on the third via pad part 311.

The upper dielectric layer 103 may have therein an upper via pattern 53 in contact with the third redistribution pattern 310. The lower dielectric layer 99 may have therein a lower conductive pad 40 in contact with the upper via pattern 53. The lower conductive pad 40 and the upper via pattern 53 may be integrally connected to each other. An external connection terminal 918 may be bonded to the lower conductive pad 40. Other configurations may be identical or similar to those discussed with reference to FIGS. 9 and 10.

Figure 13:
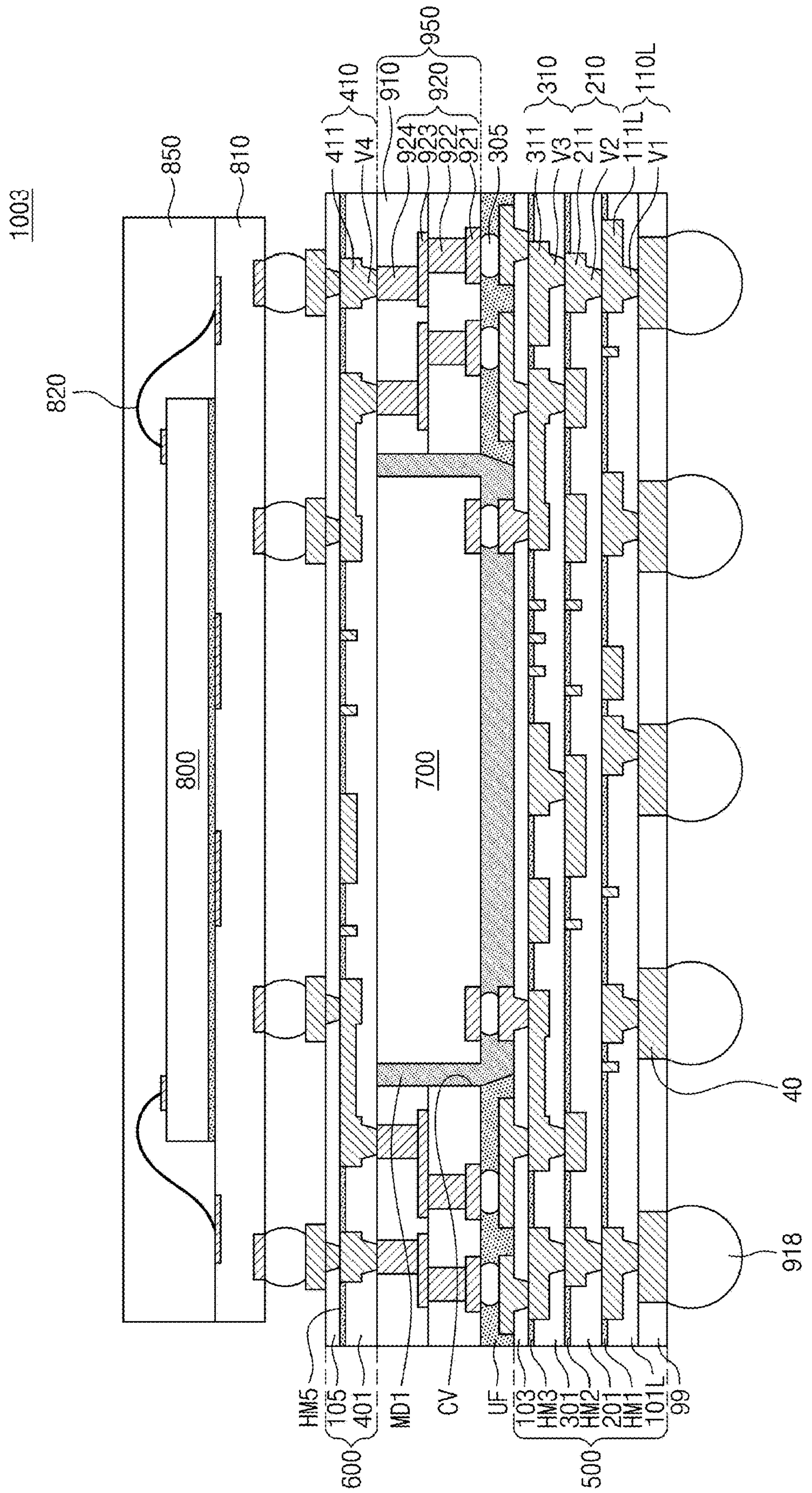
FIG. 13 illustrates a cross-sectional view showing a semiconductor package according to some example embodiments of inventive concepts.

FIG. 13 illustrates a cross-sectional view showing a semiconductor package according to some example embodiments of inventive concepts.

Referring to FIG. 13, a semiconductor package 1003 according to the present embodiment may further include a connection substrate 950 that lies on a lower redistribution substrate 500 and includes a cavity region CV. A first semiconductor apparatus 700 may be disposed in the cavity region CV. The connection substrate 950 may include a plurality of base layers 910 and a conductive structure 920. The base layers 910 may include a dielectric material. For example, the base layers 910 may include a carbon-based material, a ceramic, or a polymer. The conductive structure 920 may include a connection pad 921, a first connection via 922, a connection line 923, and a second connection via 924.

The connection substrate 950 may be connected through a third internal connection member 305 to the lower redistribution substrate 500. An under-fill layer UF may be interposed between the connection substrate 950 and the lower redistribution substrate 500. A first molding member MD1 may fill a space between the first semiconductor apparatus 700 and an inner wall of the cavity region CV of the connection substrate 950.

Other configurations may be identical or similar to those discussed with reference to FIGS. 9 and 10.

According to embodiments of inventive concepts, an interconnection structure and a semiconductor package may include a hardmask pattern formed of a dielectric material, and warpage may be suppressed or controlled. Moreover, in a method of fabricating the interconnection structure and the semiconductor package, because the hardmask pattern is formed of a dielectric material, no process may be required to remove the hardmask pattern and thus a simplified fabrication may be achieved. As a result, the interconnection structure and the semiconductor package may increase in reliability.

While some example embodiments of inventive concepts have been particularly shown and described, it will be understood by one of ordinary skill in the art that variations in form and detail may be made therein without departing from the spirit and scope of inventive concepts in the attached claims.

What is claimed is:

1. A method of manufacturing an interconnection structure, comprising:

providing a dielectric layer;

forming a hardmask layer including a dielectric material having an etch selectivity with respect to the dielectric layer and covering an upper surface of the dielectric layer;

forming a hardmask pattern by etching the hardmask layer with a mask pattern;

forming a via hole and trenches in the dielectric layer by etching the dielectric layer using the mask pattern and the hardmask pattern as masks; and forming an interconnection pattern covering the via hole and the trenches, wherein the interconnection pattern includes a via part covering the via hole, a pad part vertically overlapping the via part, and a line part extending from the pad part, and wherein a bottom surface of the pad part, a bottom surface of the line part, and a lateral surface of the via part are in contact with the dielectric layer, wherein the via hole and the trenches are defined by the dielectric layer such that the dielectric layer surrounds the via part, the pad part, and the line part in a lateral direction, and wherein the dielectric layer is a single dielectric layer.

2. The method of manufacturing the interconnection structure of claim 1, wherein the trenches include a first trench vertically overlapping the via hole and a groove extending from the first trench, wherein the first trench, the via hole, and the groove are in the dielectric layer, wherein the pad part fills the first trench, and the line part fills the groove.

3. The method of manufacturing the interconnection structure of claim 2, wherein a level of a bottom surface of the first trench is higher than a level of a bottom surface of the groove.

4. The method of manufacturing the interconnection structure of claim 3, wherein a level difference between the bottom surface of the first trench and the bottom surface of the groove is in a range of 0.3 μm to 0.8 μm.

5. The method of manufacturing the interconnection structure of claim 1, further comprising removing the mask pattern by performing an ashing process after forming the via hole and the trenches by etching the dielectric layer.

6. The method of manufacturing the interconnection structure of claim 1, wherein forming the interconnection pattern includes:

deposing a barrier/seed layer on the via hole and the trenches;

forming a metal layer on the barrier/seed layer; and performing a planarization process on the barrier/seed layer and the metal layer.

7. The method of manufacturing the interconnection structure of claim 1, wherein a top surface of the pad part and a top surface of the line part are coplanar with a top surface of the hardmask pattern.

8. The method of manufacturing the interconnection structure of claim 1, wherein the forming the via hole and the trenches in the dielectric layer includes forming one of the trenches overlapping the via hole in the dielectric layer, a width of the via hole is smaller than a width of the one of the trenches such that a step portion of the dielectric layer is between the via hole and the one of the trenches, and the step portion of the dielectric layer corresponds to a bottom surface of the one of the trenches, and a thickness of the pad part is 1.1 times to 1.25 times a thickness of the line part.

9. The method of manufacturing the interconnection structure of claim 1, wherein the dielectric layer includes at least one of polyimide, polybenzoxazole, phenolic polymers, and benzocyclobutene polymers and wherein the hardmask pattern includes a silicon oxide layer.

10. The method of manufacturing the interconnection structure of claim 1, wherein a sidewall of the via part has a rounded shape.

11. The method of manufacturing the interconnection structure of claim 1, wherein a slope of a sidewall of the via part decreases as the sidewall approaches a top region of the via part from a bottom surface of the via part.

12. A method of manufacturing an interconnection structure, comprising:

providing a lower dielectric layer;

forming a first hardmask layer including a dielectric material having an etch selectivity with respect to the lower dielectric layer and conformally covering an upper surface of the lower dielectric layer;

forming a first hardmask pattern by etching the first hardmask layer using a first mask pattern as a first mask;

forming a lower hole by etching the lower dielectric layer using the first mask pattern and the first hardmask pattern as a second mask;

forming a lower conductive pattern covering the lower hole;

providing an internal dielectric layer on the lower conductive pattern and the first hardmask pattern;

forming a second hardmask layer including a dielectric material having an etch selectivity with respect to the internal dielectric layer and covering an upper surface of the internal dielectric layer;

forming a second hardmask pattern by etching the second hardmask layer using a second mask pattern as a third mask;

forming a via hole and trenches in the internal dielectric layer by etching the internal dielectric layer using the second mask pattern and the second hardmask pattern as masks; and forming an interconnection pattern covering the via hole and the trenches, wherein the interconnection pattern includes a via part covering the via hole, a pad part vertically overlapping the via part, and a line part extending from the pad part, wherein a bottom surface of the pad part, a bottom surface of the line part, and a lateral surface of the via part are in contact with the internal dielectric layer, wherein the via hole and the trenches are defined by the internal dielectric layer such that the internal dielectric layer surrounds the via part, the pad part, and the line part in a lateral direction, and wherein the internal dielectric layer is a single internal dielectric layer.

13. The method of manufacturing the interconnection structure of claim 12, wherein each of the first hardmask pattern and the second hardmask pattern includes a silicon oxide layer, and a density of the second hardmask pattern is different from a density of the first hardmask pattern.

14. The method of manufacturing the interconnection structure of claim 12, wherein each of the first hardmask pattern and the second hardmask pattern includes a silicon oxide layer, and a composition of silicon and oxygen in the second hardmask pattern is different from a composition of silicon and oxygen in the first hardmask pattern.

15. The method of manufacturing the interconnection structure of claim 12, wherein forming the interconnection pattern includes:

deposing a barrier/seed layer on the via hole and the trenches;

forming a metal layer on the barrier/seed layer; and performing a planarization process on the barrier/seed layer and the metal layer.

16. The method of manufacturing the interconnection structure of claim 12, wherein the trenches include a first trench vertically overlapping the via hole and a groove extending from the first trench, wherein the pad part fills the first trench and the line part fills the groove, and wherein a level of a bottom surface of the first trench is higher than a level of a bottom surface of the groove.

17. The method of claim 15, further comprising removing the second mask pattern by performing an ashing process after forming the via hole and the trenches by etching the internal dielectric layer.

18. The method of manufacturing the interconnection structure of claim 12, wherein the forming the via hole and the trenches in the internal dielectric layer includes forming one of the trenches overlapping the via hole in the internal dielectric layer, a width of the via hole is smaller than a width of the one of the trenches such that a step portion of the internal dielectric layer is between the via hole and the one of the trenches, the step portion of the internal dielectric layer corresponds to a bottom surface of the one of the trenches, and a top surface of the pad part and a top surface of the line part are coplanar with a top surface of the second hardmask pattern.

19. The method of manufacturing the interconnection structure of claim 12, wherein the internal dielectric layer includes at least one of polyimide, polybenzoxazole, phenolic polymers, and benzocyclobutene polymers.

20. The method of manufacturing the interconnection structure of claim 12, wherein a width of the pad part is greater than a width of the line part, and a level of the bottom surface of the pad part is lower than the level of a bottom surface of the line part.

* * * * *